(12) United States Patent
Bunsen et al.

(10) Patent No.: US 12,732,197 B2
(45) Date of Patent: Sep. 8, 2026

(54) ALL DIGITAL PHASE-LOCKED LOOP CIRCUIT

(71) Applicant: Sony Semiconductor Solutions Corporation, Kanagawa (JP)

(72) Inventors: Keigo Bunsen, Kanagawa (JP); Masahisa Tamura, Kanagawa (JP); Tuan Van Pham, Kanagawa (JP); Naoki Yoshimi, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 116 days.

(21) Appl. No.: 18/841,566

(22) PCT Filed: Mar. 20, 2023

(86) PCT No.: PCT/JP2023/010811
§ 371 (c)(1),
(2) Date: Feb. 28, 2025

(87) PCT Pub. No.: WO2023/195329
PCT Pub. Date: Oct. 12, 2023

(65) Prior Publication Data

US 2026/0005695 A1 Jan. 1, 2026

(30) Foreign Application Priority Data

Apr. 5, 2022 (JP) ................................ 2022-063008

(51) Int. Cl.
*H03L 7/087* (2006.01)
*H03L 7/08* (2006.01)
(Continued)

(52) U.S. Cl.
CPC ............ *H03L 7/087* (2013.01); *H03L 7/0802* (2013.01); *H03L 7/085* (2013.01); *H03L 7/0991* (2013.01); *H03L 7/197* (2013.01); *H03L 2207/50* (2013.01)

(58) Field of Classification Search
CPC ..... H03L 7/087; H03L 7/0802; H03L 7/0991; H03L 7/197; H03L 2207/50; H03L 7/085
(Continued)

(56) References Cited

U.S. PATENT DOCUMENTS 7,888,973 B1 2/2011 Rezzi
8,058,915 B2 * 11/2011 Chiu ....................... H03L 7/093 331/25
(Continued)

FOREIGN PATENT DOCUMENTS

JP 2002076886 A 3/2002
JP 2009246484 A 10/2009
(Continued)

OTHER PUBLICATIONS

Seon-Kyoo Lee et al: "A 1GHz ADPLL with a 1-11 1.25ps minimum-resolution sub-exponent TDC in 0.18Å m CMOS", Solid-State Circuits Conference Digest of Technical Papers (ISSCC), 2010 IEEE International, IEEE, Piscataway, NJ, USA, Feb. 7, 2010 (Feb. 7, 2010), pp. 482-483, XP031649929,.
(Continued)

*Primary Examiner* — Arnold M Kinkead
(74) *Attorney, Agent, or Firm* — Michael Best & Friedrich LLP

(57) ABSTRACT

All digital phase-locked loop circuits are disclosed. In one example, an all digital phase-locked loop circuit includes a first time-to-digital converter that performs phase difference detection at a first resolution, and a second time-to-digital converter that performs phase difference detection at a
(Continued)

second resolution finer than the first resolution and that is arranged in parallel with the first time-to-digital converter. The second time-to-digital converter is configured to allow it to be disabled, and the first time-to-digital converter outputs a clock synchronization selection signal used for synchronizing a reference clock signal to a clock synchronization unit that generates a clock signal of a digital part.

11 Claims, 18 Drawing Sheets

(51) Int. Cl.
*H03L 7/085* (2006.01)
*H03L 7/099* (2006.01)
*H03L 7/197* (2006.01)

(58) Field of Classification Search
USPC ................ 331/1 A, 16, 17, 18, 34; 375/376; 327/158, 156
See application file for complete search history.

(56) References Cited

U.S. PATENT DOCUMENTS 8,830,001 B2 * 9/2014 Zhuang .................... H03C 5/00 331/34
2020/0192301 A1 6/2020 Khoury
2022/0029779 A1 1/2022 Lee
2023/0231567 A1 * 7/2023 Monk ..................... H03L 7/087 327/156

FOREIGN PATENT DOCUMENTS

JP 2015154444 A 8/2015
JP 2019004330 A 1/2019
WO 2012153375 A1 11/2012

OTHER PUBLICATIONS

International Search Report (PCT/ISA/210), International Application No. PCT/JP2023/010811, dated Jun. 6, 2023.

* cited by examiner

FIG. 1

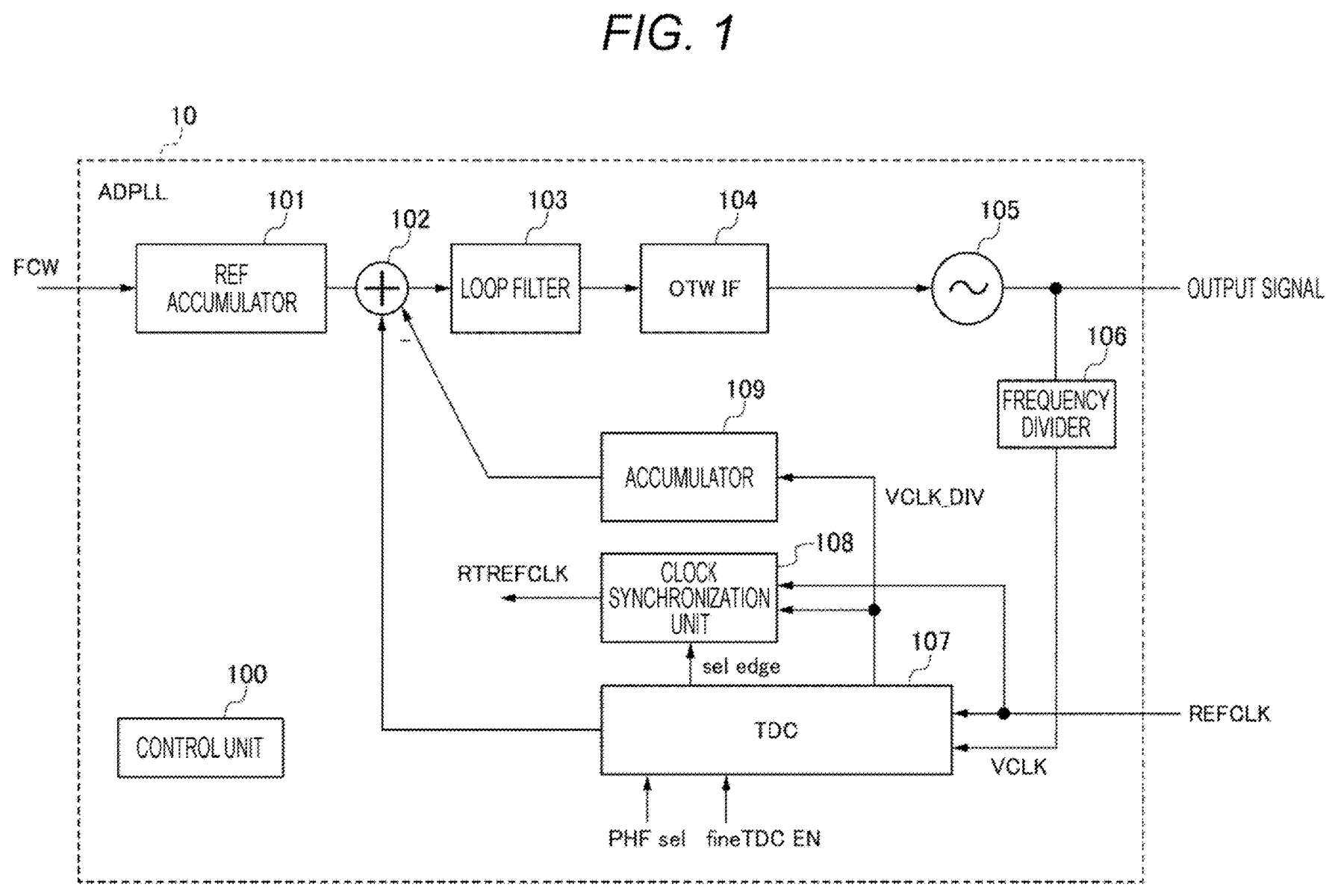

10
ADPLL
FCW
101
REF ACCUMULATOR
102
103
LOOP FILTER
104
OTW IF
105
OUTPUT SIGNAL
106
FREQUENCY DIVIDER
REFCLK
VCLK
107
TDC
VCLK_DIV
108
CLOCK SYNCHRONIZATION UNIT
sel edge
109
ACCUMULATOR
RTREFCLK
PHF sel
fineTDC EN
100
CONTROL UNIT

FIG. 2

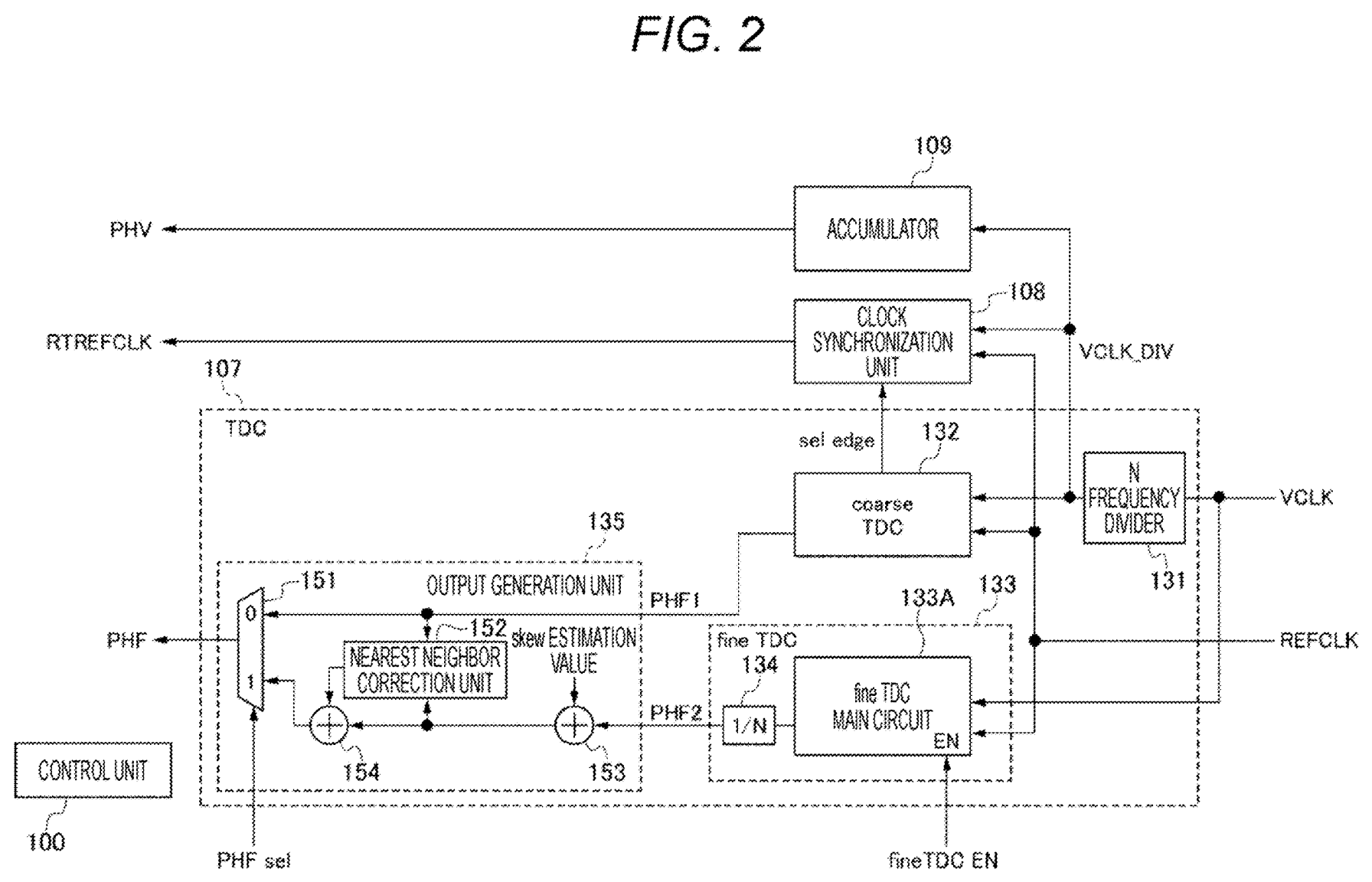

VCLK
REFCLK
N FREQUENCY DIVIDER
131
VCLK_DIV
109
ACCUMULATOR
108
CLOCK SYNCHRONIZATION UNIT
132
coarse TDC
sel edge
133
133A
fine TDC MAIN CIRCUIT
EN
fineTDC EN
fine TDC
134
1/N
PHF1
PHF2
135
OUTPUT GENERATION UNIT
skew ESTIMATION VALUE
152
NEAREST NEIGHBOR CORRECTION UNIT
153
154
151
0
1
PHF sel
107
TDC
PHV
RTREFCLK
PHF
CONTROL UNIT
100

FIG. 5

| coarse TDC | fine TDC | $V_n$ |
|---|---|---|
| 0.75 | 0.125～0.5 | +0.5 |
| | 0.00～0.125 | +1.0 |
| 0.5 | 0.375～0.5 | 0 |
| | 0.00～0.375 | +0.5 |
| 0.25 | 0.125～0.5 | 0 |
| | 0.00～0.125 | +0.5 |
| 0 | 0.375～0.5 | −0.5 |
| | 0.00～0.375 | 0 |

FIG. 9

| coarse TDC | fine TDC AFTER ADDITION OF skew ESTIMATION VALUE | $V_n$ |
| --- | --- | --- |
| 0.75 | 0.625～1 | 0 |
| | 0.125～0.625 | +0.5 |
| | 0.00～0.125 | +1.0 |
| 0.5 | 0.875～1 | −0.5 |
| | 0.375～0.875 | 0 |
| | 0.00～0.375 | +0.5 |
| 0.25 | 0.625～1 | −0.5 |
| | 0.125～0.625 | 0 |
| | 0～0.125 | +0.5 |
| 0 | 0.875～1 | −1 |
| | 0.375～0.875 | −0.5 |
| | 0.00～0.375 | 0 |

ALL DIGITAL PHASE-LOCKED LOOP CIRCUIT

TECHNICAL FIELD

The present disclosure relates to an all digital phase-locked loop circuit, and in particular to an all digital phase-locked loop circuit that can be more easily designed.

BACKGROUND ART

There is an all digital PLL (ADPLL) circuit in which all components of a phase locked loop (PLL) circuit are digitized. The ADPLL circuit has a configuration in which a time to digital converter (TDC) is used to extract phase difference information of an output of a digitally controlled oscillator (DCO) that controls a frequency by digital control.

For example, as a configuration using a TDC in the ADPLL circuit, there are configurations disclosed in Patent Documents 1 and 2. Furthermore, Patent Document 3 discloses a configuration of a TDC applicable to an ADPLL circuit.

CITATION LIST

Patent Document

Patent Document 1: Japanese Patent Application Laid-Open No. 2002-76886

Patent Document 2: Japanese Patent Application Laid-Open No. 2015-154444

Patent Document 3: Japanese Patent Application Laid-Open No. 2009-246484

SUMMARY OF THE INVENTION

Problems to be Solved by the Invention

In a case where the configuration using the TDC in the ADPLL circuit is adopted, it is required to design the ADPLL circuit more easily.

The present disclosure has been made in view of such a situation, and an object of the present disclosure is to enable design more easily.

Solutions to Problems

An all digital phase-locked loop circuit according to one aspect of the present disclosure includes: a first time-to-digital converter that performs phase difference detection at a first resolution; and a second time-to-digital converter that performs phase difference detection at a second resolution finer than the first resolution and that is arranged in parallel with the first time-to-digital converter, in which the second time-to-digital converter is configured to allow being disabled, and the first time-to-digital converter outputs a clock synchronization selection signal used for synchronizing a reference clock signal to a clock synchronization unit that generates a clock signal of a digital part.

In an all digital phase-locked loop circuit according to one aspect of the present disclosure, a first time-to-digital converter that performs phase difference detection at a first resolution and a second time-to-digital converter that performs phase difference detection at a second resolution finer than the first resolution are arranged in parallel, in which the second time-to-digital converter is configured to allow being disabled, and the first time-to-digital converter outputs a clock synchronization selection signal used for synchronizing a reference clock signal to a clock synchronization unit that generates a clock signal of a digital part.

Note that the all digital phase-locked loop circuit according to one aspect of the present disclosure may be an independent device or an internal block configuring one device.

BRIEF DESCRIPTION OF DRAWINGS

FIG. 1 is a block diagram illustrating a configuration example of an embodiment of an ADPLL circuit to which the present disclosure is applied.

FIG. 2 is a block diagram illustrating an example configuration of a TDC.

FIG. 5 is a diagram illustrating an example of an operation table of the output generation unit.

FIG. 9 is a diagram illustrating an example of an operation table of the output generation unit at the time of adding the skew estimation value.

MODE FOR CARRYING OUT THE INVENTION

<System Configuration>

Figure 3:
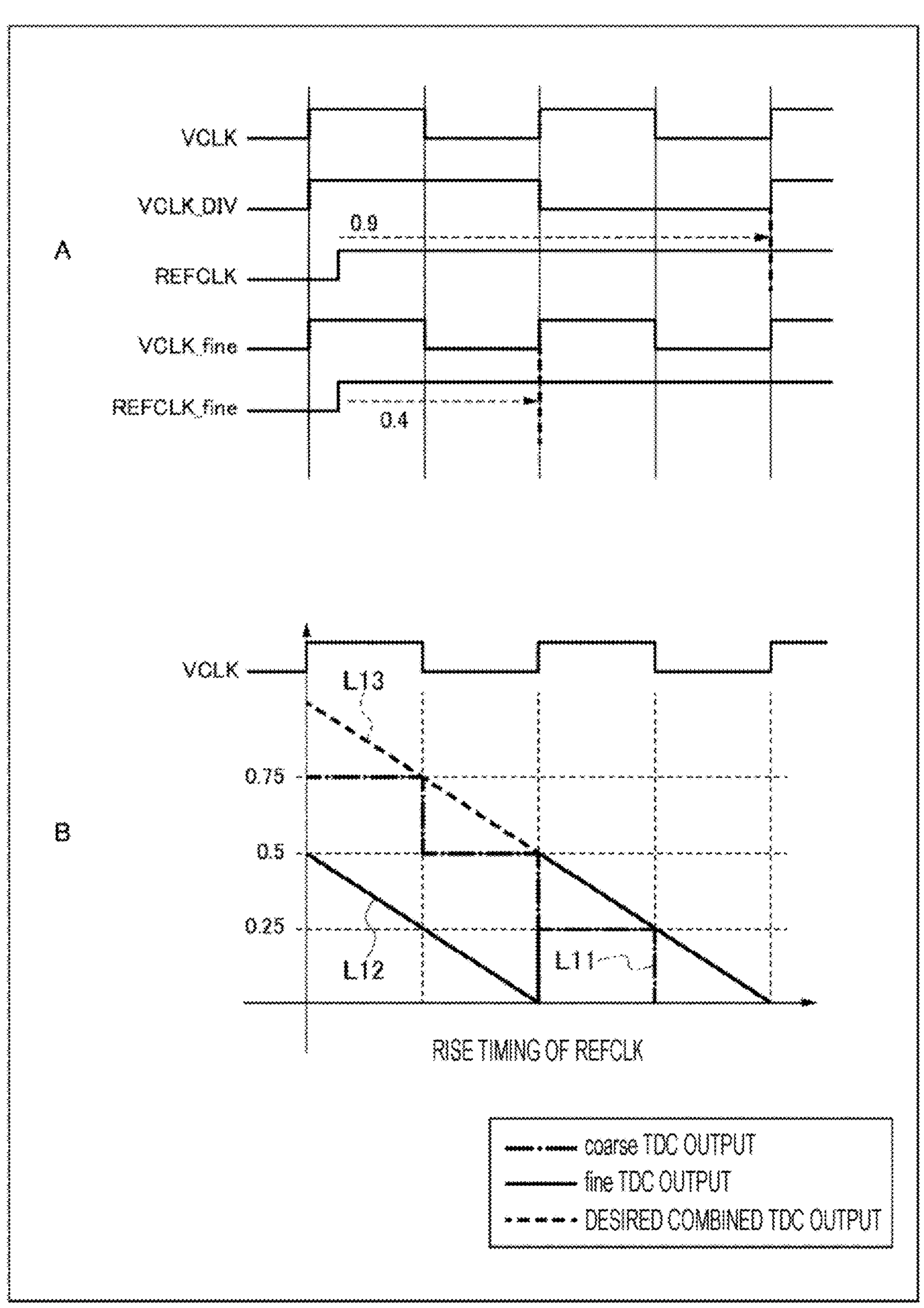
FIG. 3 is a timing chart illustrating an operation example of a coarse TDC and a fine TDC.

FIG. 1 is a block diagram illustrating a configuration example of an embodiment of an ADPLL circuit to which the present disclosure is applied.

An ADPLL circuit 10 is an all digital phase-locked loop circuit that generates an output from a DCO that controls a frequency by digital control, from a digital frequency control input (frequency command word (FCW)) and a reference frequency input (reference clock signal: REFCLK)

from the outside, adjusts the DCO on the basis of a difference from the FCW obtained from the output signal, and performs an operation of adjusting the output to a control value by the FCW based on the reference frequency input.

In FIG. 1, the ADPLL circuit 10 includes a control unit 100, an REF accumulator 101, an adder 102, a loop filter 103, an OTW IF 104, a DCO 105, a frequency divider 106, a TDC 107, a clock synchronization unit 108, and an accumulator 109. The control unit 100 controls the operation of each unit of the ADPLL circuit 10.

The DCO 105 is a digitally controlled oscillator that outputs a signal having an oscillation frequency indicated by an oscillator control word (oscillator tuning word (OTW)) input from the OTW IF 104. An output signal output from the DCO 105 is an output (clock signal: CLK) of the ADPLL circuit 10. The frequency divider 106 frequency-divides an output signal from the DCO 105 at a predetermined frequency division ratio, and outputs the signal to the TDC 107 as a frequency-divided output signal (VCLK). Note that the frequency divider 106 is provided as necessary, and in a case where the frequency divider 106 is not provided, the output signal from the DCO 105 is directly input to the TDC 107 as VCLK. In the following description, a case where the frequency divider 106 is provided as illustrated in FIG. 1 and VCLK from the frequency divider 106 is input to the TDC 107 will be described.

The TDC 107 is a time-to-digital converter that detects phase difference information of an output signal of the DCO 105 from REFCLK input as a reference clock signal and VCLK input from the frequency divider 106. The TDC 107 outputs the phase difference information to the adder 102. Furthermore, the TDC 107 outputs a VCLK_DIV obtained by dividing VCLK at a predetermined frequency division ratio to the clock synchronization unit 108 and the accumulator 109.

The TDC 107 outputs a clock synchronization selection signal (hereinafter, also referred to as a sel edge signal) used for synchronizing REFCLK with VCLK_DIV to the clock synchronization unit 108. Furthermore, an enable signal (hereinafter, also referred to as a fine TDC EN signal) and an output selection signal (hereinafter, also referred to as a PHF sel signal) are input to the TDC 107 under the control of the control unit 100. Details of the configuration of the TDC 107 will be described later with reference to FIG. 2.

The clock synchronization unit 108 generates RTREFCLK by synchronizing REFCLK input as a reference clock signal using the sel edge signal and VCLK_DIV input from the TDC 107, and outputs RTREFCLK to each unit. The RTREFCLK is a clock signal of the digital part of the ADPLL circuit 10. The accumulator 109 functions as a counter that accumulates a predetermined value (for example, 1) in synchronization with VCLK_DIV input from the TDC 107, and outputs the accumulated value to the adder 102.

The REF accumulator 101 inputs phase control information obtained from FCW input thereto to the adder 102. The adder 102 adds the output (accumulated value as an integer part) from the accumulator 109 and the output (phase difference information as a decimal part) from the TDC 107 to obtain phase information. Furthermore, the adder 102 subtracts the phase information obtained by the addition from the phase control information input from the REF accumulator 101 to generate phase error information, and outputs the phase error information to the loop filter 103.

The loop filter 103 performs filter processing on the phase error information input from the adder 102, generates a control value for the DCO 105, and outputs the control value to the OTW IF 104. The OTW IF 104 generates OTW on the basis of the control value input from the loop filter 103 and outputs OTW to the DCO 105. The oscillation frequency of the DCO 105 is controlled by repeating the above-described operation.

<TDC Configuration>

FIG. 2 is a block diagram illustrating an example configuration of the TDC 107 illustrated in FIG. 1.

In FIG. 2, the TDC 107 includes an N frequency divider 131, a coarse TDC 132, a fine TDC 133, and an output generation unit 135. The fine TDC 133 includes a fine TDC main circuit 133A and a 1/N multiplier 134.

In the TDC 107, a coarse TDC 132 and a fine TDC 133 are provided in parallel. The coarse TDC 132 performs phase difference detection at a first resolution. The fine TDC 133 performs phase difference detection at a second resolution finer than the first resolution. The fine TDC 133 can be disabled by the fine TDC EN signal. The coarse TDC 132 outputs the sel edge signal to the clock synchronization unit 108.

In a case where a bad jitter is allowed in the ADPLL circuit 10, the fine TDC 133 is disabled and only the coarse TDC 132 can be used to achieve a low power consumption operation. On the other hand, in a case where a low jitter is required in the ADPLL circuit 10, the fine TDC 133 is enabled and the coarse TDC 132 and the fine TDC 133 can be combined to achieve a high resolution operation.

In general, it is necessary to minimize a clock skew (time difference of clocks) between the clock synchronization unit 108 and the TDC 107 (coarse TDC 132). This is because the sel edge signal generated on the basis of the phase difference information (phase difference information between REFCLK and VCLK_DIV) measured by the TDC 107 (coarse TDC 132) is transmitted to the clock synchronization unit 108, and in response, the clock synchronization unit 108 selects a VCLK_DIV edge to synchronize REFCLK. The sel edge signal is a signal indicating which of the rise and fall of VCLK_DIV is farther from REFCLK edge.

At the time of synchronization, if the timings of the rise of REFCLK and the synchronization edge of VCLK_DIV are too close to each other, metastability occurs, and a problem occurs in subsequent signal processing. Therefore, a sel edge signal is used to avoid the problem. As a premise, in the clock synchronization unit 108, the phase relationship between REFCLK and VCLK_DIV and the phase relationship with the coarse TDC 132 need to be the same, and thus minimization of the clock skew is required. In the ADPLL circuit 10, the coarse TDC 132 having a coarse resolution and a small size can be arranged (physically) close to the clock synchronization unit 108 in the TDC 107, and the clock skew can be minimized.

As described above, the TDC 107 can realize the operation mode switching function of performing the low power consumption operation using only the coarse TDC 132 in a case where a bad jitter is allowed, and performing the high resolution operation with the fine TDC 133 when a low jitter is required. Furthermore, in the TDC 107, the sel edge signal is output from the coarse TDC 132, which is easily downsized, so that a clock skew design that matches the clock synchronization unit 108 is facilitated.

In the TDC 107, the output generation unit 135 outputs phase difference information (PHF) on the basis of the output of the coarse TDC 132 (PHF1), the output of the fine TDC 133 (PHF2), and the PHF sel signal. Here, when the fine TDC 133 is disabled, the phase difference information (PHF) is output on the basis of the output (PHF1) of the coarse TDC 132. On the other hand, when the fine TDC 133 is enabled, the phase difference information (PHF) is output on the basis of the output (PHF1) of the coarse TDC 132, the output (PHF2) of the fine TDC 133, and the PHF sel.

Since the coarse TDC 132 and the fine TDC 133 have different outputs, the output generation unit 135 outputs a combination of these TDC outputs. In a case where the fine TDC 133 is disabled, the output of the coarse TDC 132 is output as it is (or may be delayed). In a case where the fine TDC 133 is enabled, the output of the coarse TDC 132 can be output as it is or a value generated by combining the outputs of the coarse TDC 132 and the fine TDC 133 can be output on the basis of the PHF sel signal.

The fine TDC 133 typically performs averaging processing to obtain the period of VCLK therein, and may output an instable value immediately after being enabled. Therefore, by controlling the output generation unit 135 using the PHF sel signal different from the fine TDC EN signal of the fine TDC 133, propagation of the instable value to subsequent stages, and then malfunction of the ADPLL circuit 10 can be prevented. Furthermore, the fine TDC 133 is enabled in advance, and the PHF sel signal is switched at a necessary timing after stabilization, whereby seamless operation mode switching can be realized.

As described above, the output generation unit 135 can generate phase difference information by combining the output of the coarse TDC 132 and the output of the fine TDC 133. Furthermore, the output generation unit 135 performs output on the basis of the PHF sel signal different from the fine TDC EN signal of the fine TDC 133, so that it is possible to avoid the influence of the unstable operation immediately after enabling the fine TDC 133 on the loop operation and realize seamless operation mode switching.

The N frequency divider 131 is provided for a VCLK input common to the coarse TDC 132, the clock synchronization unit 108, and the accumulator 109. Here, N is an integer. In this case, the resolution of the coarse TDC 132 converted for the output needs to be finer than 1/N. That is, since the output conversion measurement range (hereinafter, also referred to as a measurement range) of the fine TDC 133 is 1/N and the measurement range converted for input of the fine TDC 133 matches the VCLK period, the resolution of the coarse TDC 132 is finer than VCLK period.

Here, in the TDC 107 of the ADPLL circuit 10, as a general definition, the input conversion measurement range is assumed to match the period of the high-speed clock input (VCLK). Furthermore, it is assumed that the output of the TDC 107 is obtained by normalizing the time difference between REFCLK and VCLK by the period of the high-speed clock input (VCLK). That is, the output of the TDC 107 is in the range of 0 to 1.

In a case where the N frequency divider 131 is provided, the denominator of normalization becomes N times, the input range increases by N times, and then the output value becomes 1/N times those in a case where the N frequency divider 131 is not provided, although the time difference is the same. In the fine TDC 133, the 1/N multiplier 134 is arranged at the subsequent stage of the fine TDC main circuit 133A that performs phase difference detection in order to match the input time difference with the relationship between the output values between the coarse TDC 132 and the fine TDC 133 in consideration of the change in the output of the coarse TDC 132 by the N frequency divider 131.

As described above, the slow clock operation due to the N frequency divider 131 can reduce the power consumption of the coarse TDC 132, the clock synchronization unit 108, and the accumulator 109. Moreover, by restricting the resolution of the coarse TDC 132, the information of the coarse TDC 132 can be interpolated with the information of the fine TDC 133, and the phase difference information can be correctly obtained without missing any information.

The restriction of the resolution of the coarse TDC 132 described above means that 1 LSB of the coarse TDC 132<=the output conversion measurement range of the fine TDC 133 (=1/N) is required to fill the interval in the coarse 1 LSB of the coarse TDC 132 with the fine resolution of the fine TDC 133. In a case where this is not satisfied, the interval in the 1 LSB of the coarse TDC 132 cannot be filled without any gap.

The output generation unit 135 includes a selector 151, a nearest neighbor correction unit 152, an adder 153, and an adder 154.

The nearest neighbor correction unit 152 and the adder 154 add a value corresponding to an integral multiple of 1/N (=the output conversion measurement range of the fine TDC 133) (N is a frequency division ratio of the N frequency divider 131) to the output of the fine TDC 133 to correct the addition result to a value most matching the output of the coarse TDC 132. That is, by performing such correction, the output of the coarse TDC 132 and the output of the fine TDC 133 are specifically combined. Details of operations of the nearest neighbor correction unit 152 and the adder 154 in the output generation unit 135 will be described later with reference to FIGS. 3 to 5.

The adder 153 adds a value (hereinafter, also referred to as a skew estimation value) corresponding to the skew between the coarse TDC 132 and the fine TDC 133 to the output of the fine TDC 133. As a result, it is possible to correct the mismatch of the result due to the skew existing between the coarse TDC 132 and the fine TDC 133 and output correct phase difference information. Details of the operation of the output generation unit 135 at the time of adding the skew estimation value will be described later with reference to FIGS. 6 to 12.

The selector 151 selects, on the basis of the PHF sel signal, the output of the coarse TDC 132 or the output generated on the basis of the output of the coarse TDC 132 and the output of the fine TDC 133, and outputs the selected output as phase difference information (PHF). The control unit 100 independently controls the fine TDC EN signal input to the fine TDC 133 and the PHF sel signal input to the selector 151.

The TDC 107 is configured as described above. With this configuration, for example, the following effects can be obtained. That is, since the coarse TDC 132 and the fine TDC 133 that can be disabled are provided in parallel, it is possible to provide the operation mode switching function of performing the low power consumption operation using only the coarse TDC 132 in a case where a bad jitter is allowed, and performing the high resolution operation in which the coarse TDC 132 and the fine TDC 133 are combined when a low jitter is required. Furthermore, the sel edge signal is output from the coarse TDC 132, which is easily downsized, so that a skew design that matches the clock synchronization unit 108 can be easily realized.

Furthermore, the power consumption of the coarse TDC 132, the clock synchronization unit 108, and the accumulator 109 is reduced by the slow clock operation due to the N frequency divider 131 while the information of the fine TDC 133 is interpolated in the information of the coarse TDC 132, so that the phase difference information can be correctly obtained without missing any information. Moreover, it is possible to correct the mismatch due to the skew between the coarse TDC 132 and the fine TDC 133 using the skew estimation value and output correct phase difference information.

<Operation of Output Generation Unit>

Next, the operation content of the output generation unit 135 will be described with reference to FIGS. 3 to 5. Here, a 2 frequency divider is used as the N frequency divider 131, and the resolution of the coarse TDC 132 converted for the output is set to 0.25. In addition, values stated herein are values normalized by one period of VCLK_DIV.

FIG. 3 is a timing chart illustrating an operation example of the coarse TDC 132 and the fine TDC 133 of FIG. 2. A of FIG. 3 illustrates a relationship between the TDC input timing chart and the measurement edge. In A of FIG. 3, VCLK_DIV and REFCLK are signals input to the coarse TDC 132, and VCLK_fine and REFCLK_fine are signals input to the fine TDC 133.

The coarse TDC 132 measures the time from the rise of REFCLK to the rise of VCLK_DIV. The fine TDC 133 measures the time from the rise of REFCLK_fine (here, the same signal as REFCLK) to the rise of VCLK_fine.

As illustrated in A of FIG. 3, REFCLK (REFCLK_fine) rises at a position of 0.9 for the coarse TDC 132 and at a position of 0.4 for the fine TDC 133. Each of the coarse TDC 132 and the fine TDC 133 measures time corresponding to the rise timing. However, since the resolution is finite, the output values are values obtained by rounding down by intervals determined by the resolutions.

B of FIG. 3 illustrates the relationship between the rise timings of REFCLK and the TDC output. In B of FIG. 3, the horizontal axis represents the rising timing of REFCLK, and the vertical axis represents the output value of each TDC.

As indicated by a line L11, the coarse TDC 132 is output in a coarse stepwise manner corresponding to the resolution 0.25. As indicated by the line L12, the fine TDC 133 has a fine resolution, and thus is output substantially linearly. The fine TDC 133 has an output conversion measurement range of 1/N, and when the output value exceeds 1/N, it is compared with the next edge of VCLK_fine, so that an output as folded back at 0.5 is obtained.

As a desired method of combining the coarse TDC 132 and the fine TDC 133, a straight line indicated by a line L13 having a wide measurement range of the coarse TDC 132 and a fine resolution 133 of the fine TDC is desirable.

Figure 4:
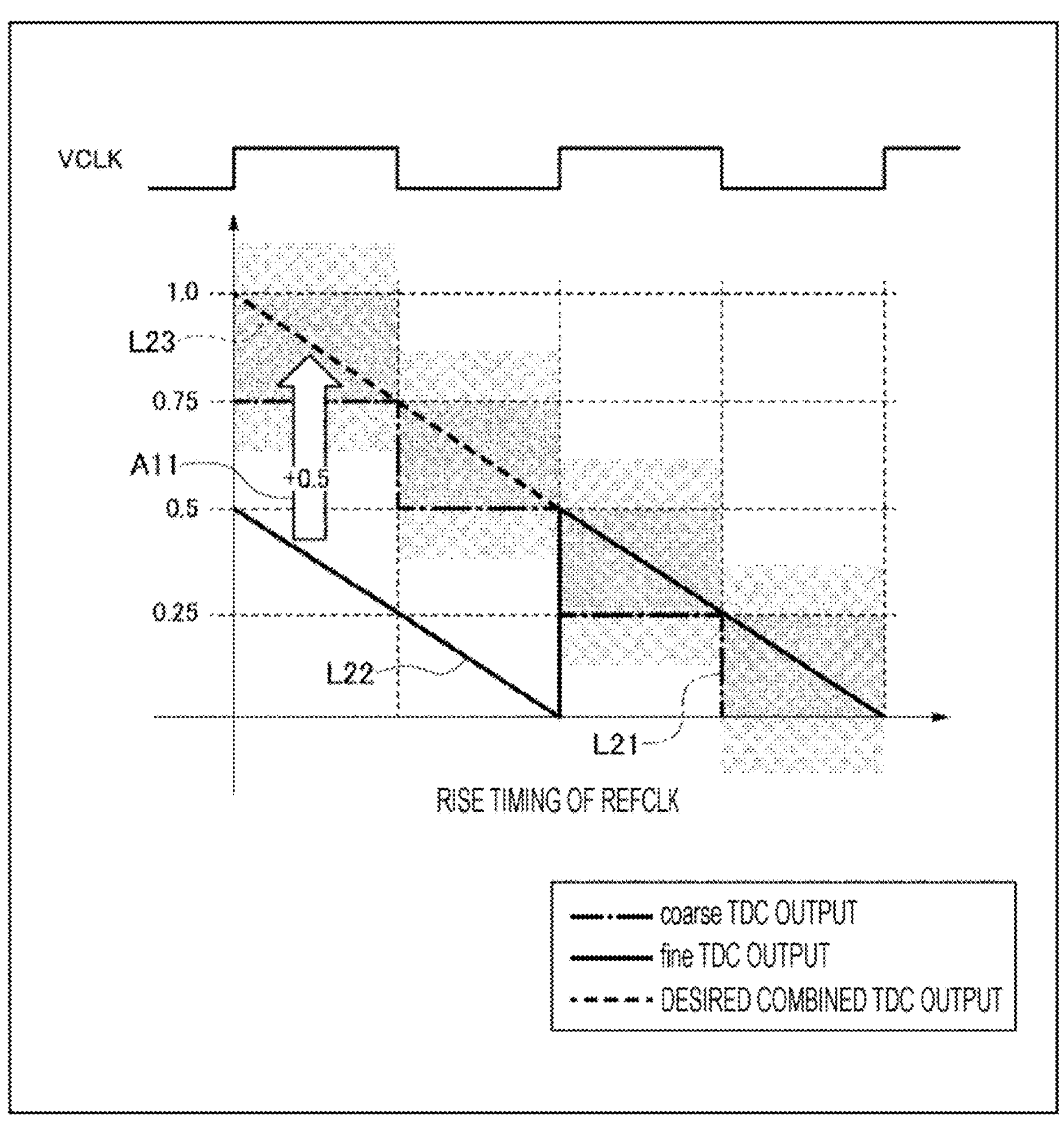
FIG. 4 is a timing chart illustrating an operation example of an output generation unit.

FIG. 4 illustrates a method of combining the coarse TDC 132 and the fine TDC 133. In FIG. 4, lines L21 to L23 correspond to lines L11 to L13 in B of FIG. 3. In the output generation unit 135, the nearest neighbor correction unit 152 and the adder 154 compare the output of the coarse TDC 132 with the output of the fine TDC 133, and select, among the numbers of integral multiples of 1/N, a value $V_n$ that makes the output of the fine TDC 133 closest to the range indicated by the output of the coarse TDC 132 when the value is added thereto, and add the selected value to the output of the fine TDC 133.

Specifically, in FIG. 4, for example, when the coarse TDC 132 outputs 0.75, the range corresponding to the region shaded with dots indicates the phase relationship of the coarse TDC 132 is in the range of 0.75 to 1 unless rounded down due to the resolution, and +0.5, which is a value that makes the output of the fine TDC 133 closest to the center of the range when the value is added thereto, is selected as $V_n$ and added (A11 in FIG. 4).

FIG. 5 is a diagram illustrating an example of an operation table of the output generation unit 135. In FIG. 5, the operation table stores $V_n$ corresponding to the outputs of the coarse TDC 132 and the fine TDC 133. As a result, the nearest neighbor correction unit 152 and the adder 154 perform case classification according to the output of the coarse TDC 132 and the output of the fine TDC 133, and select the output $V_n$ from the operation table of FIG. 5. With this combination method, a desired combined TDC output can be obtained.

<Operation of Output Generation Unit at Time of Adding Skew Estimation Value>

Next, the operation content of the output generation unit 135 at the time of adding skew estimation value will be described with reference to FIGS. 6 to 12. In a case where different delays (clock skew) exist on the clock paths of the coarse TDC 132 and the fine TDC 133, the results of the coarse TDC 132 and the fine TDC 133 have a mismatch relationship.

Figure 6:
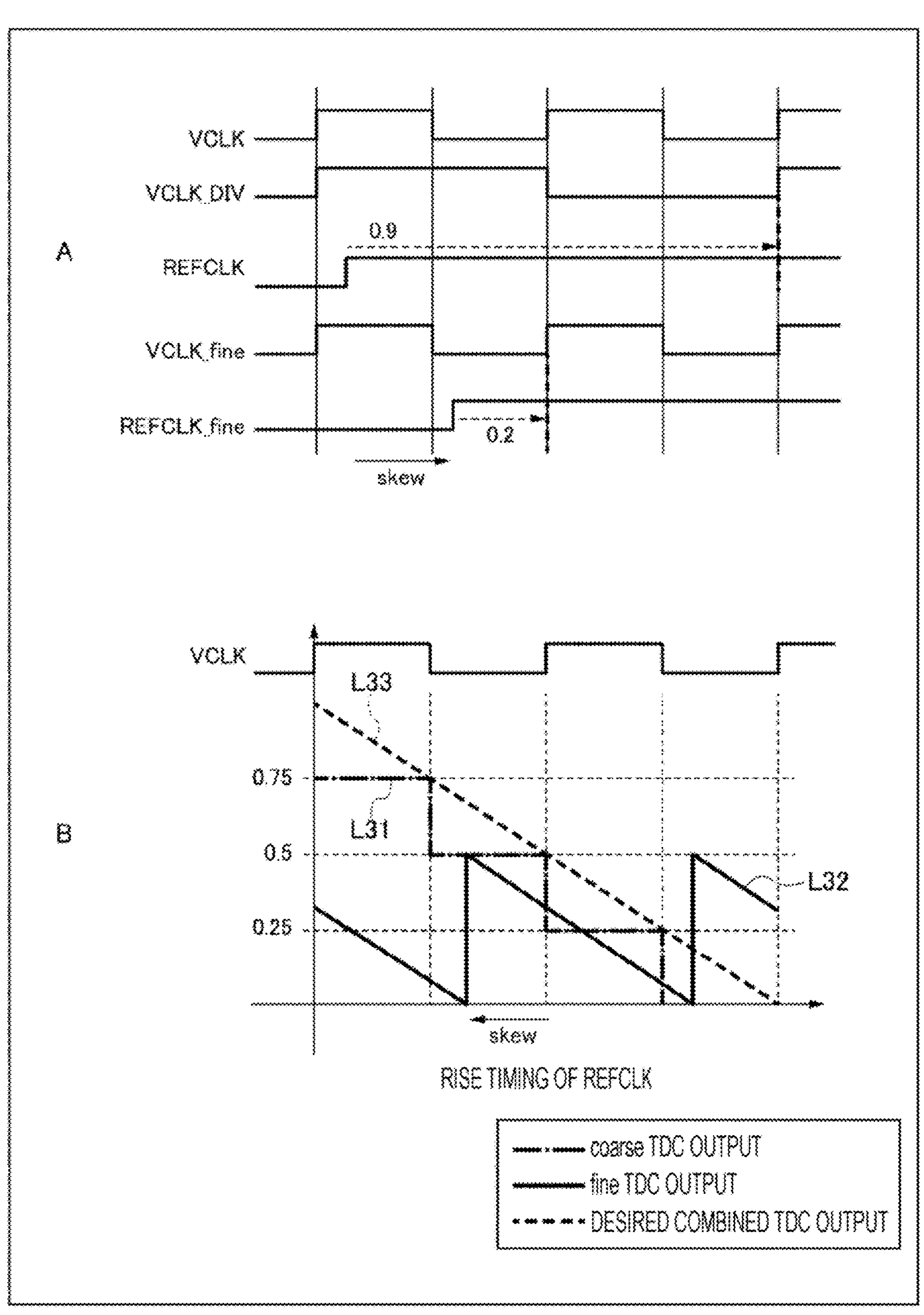
FIG. 6 is a timing chart illustrating an operation example of the coarse TDC and the fine TDC in a case where a clock skew exists.

FIG. 6 is a timing chart illustrating an operation example of the coarse TDC 132 and the fine TDC 133 in a case where a clock skew exists. That is, the timing chart of FIG. 6 corresponds to the timing chart of FIG. 3, and illustrates an example of a case where a clock skew that does not exist in a case of FIG. 3 exists.

In a case where a clock skew exists, the results of the coarse TDC 132 and the fine TDC 133 have a mismatch relationship, and this relationship is illustrated in A of FIG. 6. A of FIG. 6 illustrates a situation in which REFCLK_fine, which is an input of the fine TDC 133, is delayed by 0.2 with respect to REFCLK, which is an input of the coarse TDC 132.

In this case, as illustrated in B of FIG. 6, the output of the fine TDC 133 is shifted leftward by 0.2 as a whole due to the influence of the skew. That is, in B of FIG. 6, lines L31 to L33 correspond to the lines L11 to L13 in B of FIG. 3, but only the line L32 indicating the output of the fine TDC 133 is shifted leftward. At this time, by simulation, evaluation, or the like, the skew is estimated with an error within a value obtained from the following Formula (1), and the configuration of the output generation unit 135 in FIG. 2 enables correction for the influence of the skew using the skew estimation value, so that a correct output can be obtained.

$$\pm(1/N - Rc) \div 2 \quad (1)$$

However, in Formula (1), 1/N is equal to the output conversion measurement range of the fine TDC 133, and Rc represents the resolution of the coarse TDC 132 converted for the output. Under the conditions in the figure, the allowable error is ±(0.5−0.25)÷2=±0.125.

Figure 7:
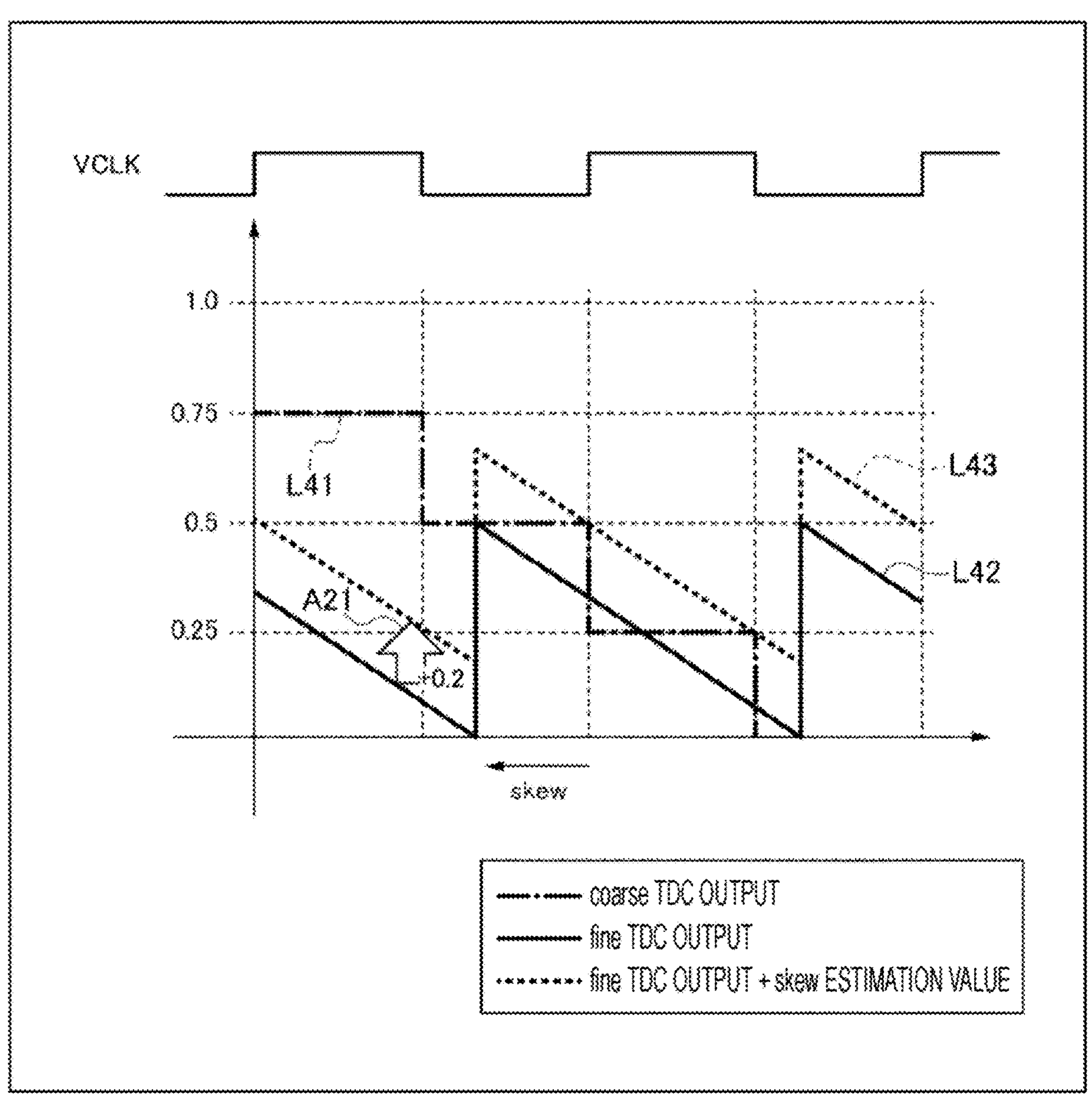
FIG. 7 is a diagram for describing an addition example of a skew estimation value.

FIG. 7 is a diagram for describing addition of a skew estimation value. In FIG. 7, lines L41 and L42 correspond to the lines L31 and L32 in B of FIG. 6, and indicate the output of the coarse TDC 132 and the output of the fine TDC 133. Furthermore, a line L43 indicates an output obtained by adding the skew estimation value to the output of the fine TDC 133.

Figure 8:
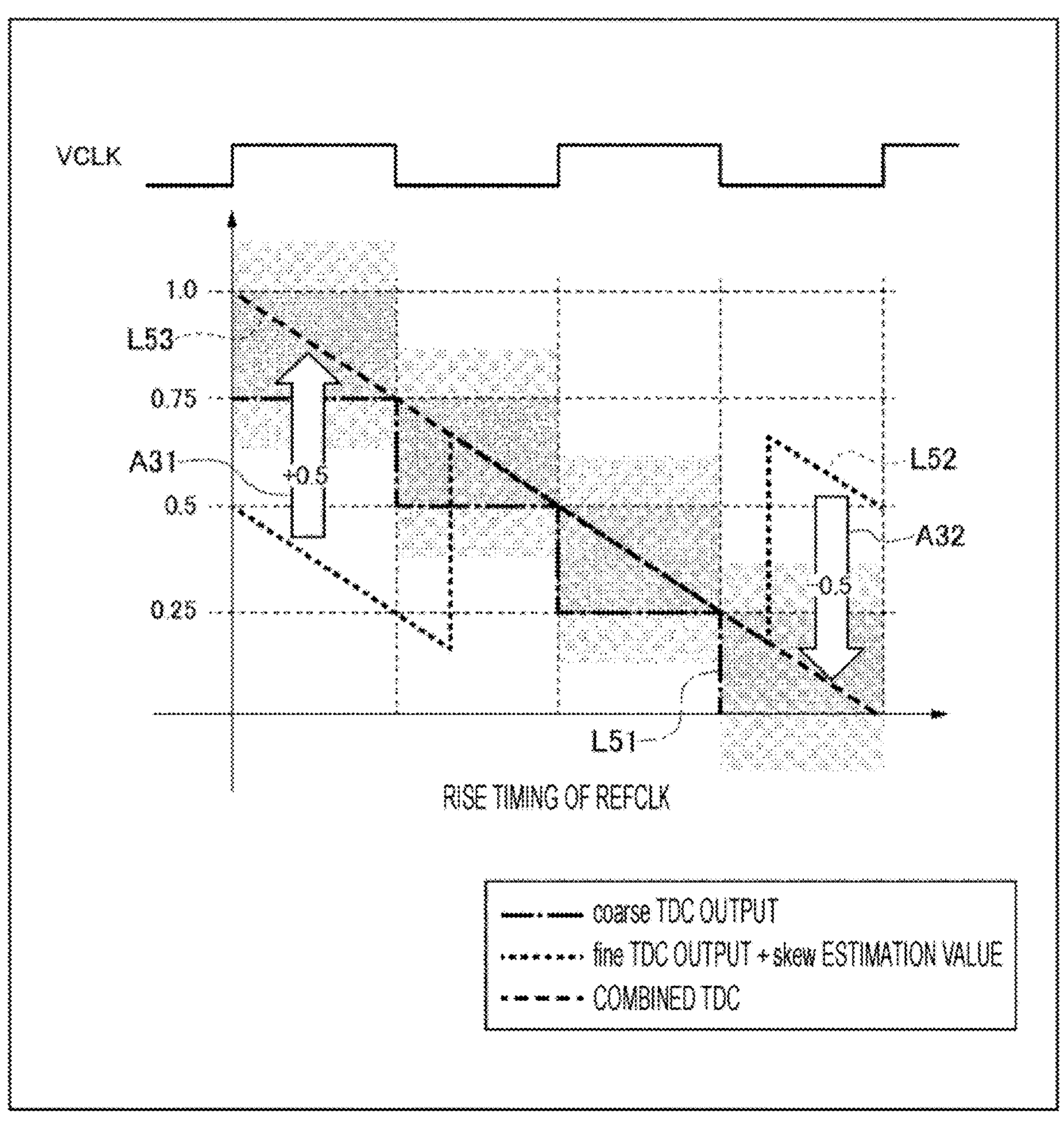
FIG. 8 is a timing chart illustrating an operation example of the output generation unit at the time of adding the skew estimation value.

As illustrated in FIG. 7, first, the adder 153 adds the skew estimation value to the output of the fine TDC 133. In FIG. 7, as illustrated by the relationship between the line L42 and the line L43, 0.2 is added to the output of the fine TDC 133 as the skew estimation value (A21 in the figure). Then, as illustrated in FIG. 8, the nearest neighbor correction unit 152 and the adder 154 compare the output of the coarse TDC 132 with the output of the fine TDC 133, and select, among the numbers of integral multiples of 1/N, a value $V_n$ that makes the output of the fine TDC 133 closest to the range indicated by the output of the coarse TDC 132 when the value is added thereto, and add the selected value to the output of the fine TDC 133.

This procedure is similar to that of FIG. 4 described above. With this procedure, a desired combined TDC output can be obtained. In FIG. 8, lines L51 and L52 correspond to the lines L41 and L43 in FIG. 7, and indicate the output of the coarse TDC 132 and the output obtained by adding the skew estimation value to the output of the fine TDC 133. Furthermore, a line L53 indicates the combined TDC output. In FIG. 8, $V_n$ of ±0.5 is selected and added to the output obtained by adding the skew estimation value to the fine TDC 133 so that the result of addition of the value becomes closest to the range of the value indicated by the output of the coarse TDC 132 (A31 and A32 in the figure).

FIG. 9 is a diagram illustrating an example of an operation table of the output generation unit 135. In FIG. 9, the operation table stores $V_n$ corresponding to the outputs of the coarse TDC 132 and the fine TDC 133. The operation table of FIG. 9 is different from the operation table of FIG. 5 in that the range of possible values is enlarged because the output of the fine TDC 133 after the addition of the skew estimation value is used.

As a result, the nearest neighbor correction unit 152 and the adder 154 perform case classification according to the output of the coarse TDC 132 and the output of the fine TDC 133 after the addition of the skew estimation value, and select the output $V_n$ from the operation table of FIG. 9. The operation table of FIG. 9 is different from the operation table of FIG. 5 in that the possible range of the value is enlarged, but the operation is performed in the same manner as in FIGS. 4 and 5 in that a value that makes the output closest to the range indicated by the output of the coarse TDC 132 when the value is added thereto is selected and added.

Figure 10:
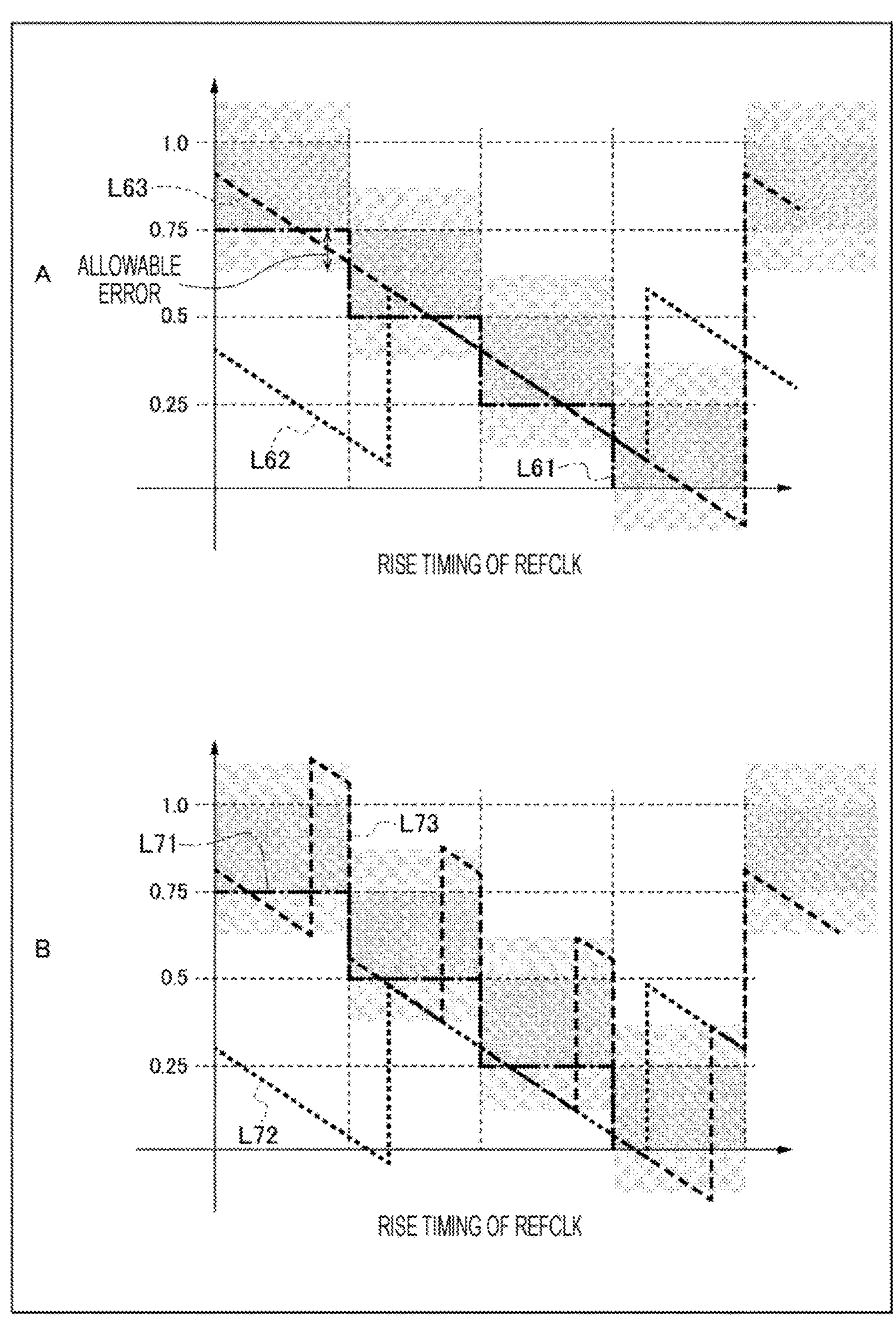
FIG. 10 is a diagram for describing the influence of a skew estimation value error.

Here, a constraint within a value obtained from the above Formula (1) will be described with reference to FIG. 10. FIG. 10 is a diagram for describing the influence of the skew estimation value error. In this condition, the above constraint is within ±0.125. In A and B of FIG. 10, lines L61 and L71 indicate the output of the coarse TDC 132, lines L62 and L72 indicate the output of the fine TDC 133 after addition of the skew estimation value, and lines L63 and L73 indicate the combined TDC output.

A of FIG. 10 illustrates a case where the error of the skew estimation value is −0.1 and within the constraint. In a case where the error of the skew estimation value does not exceed the above constraint, the combined TDC output is generated to be a continuous value even at rising timings of REFCLK on the horizontal axis, as indicated by the line L63 in A of FIG. 10.

On the other hand, B of FIG. 10 illustrates a case where the error of the skew estimation value is −0.2 exceeding the above constraint. In this case, as indicated by the line L73 in B of FIG. 10, the combined TDC output becomes discontinuous at the rise timings of REFCLK.

Note that the above constraint corresponds to a value indicated by an arrow of "allowable error" in A of FIG. 10, and this value matches the margin of the phase relationship having the smallest margin with respect to the nearest neighbor correction. That is, there is no problem even if there is an error in the skew estimation value up to the range (±0.125) corresponding to the region shaded by the dots in the figure. On the other hand, if there is an error in the skew estimation value exceeding the range (±0.125), the phase becomes discontinuous, which causes a problem.

Figure 11:
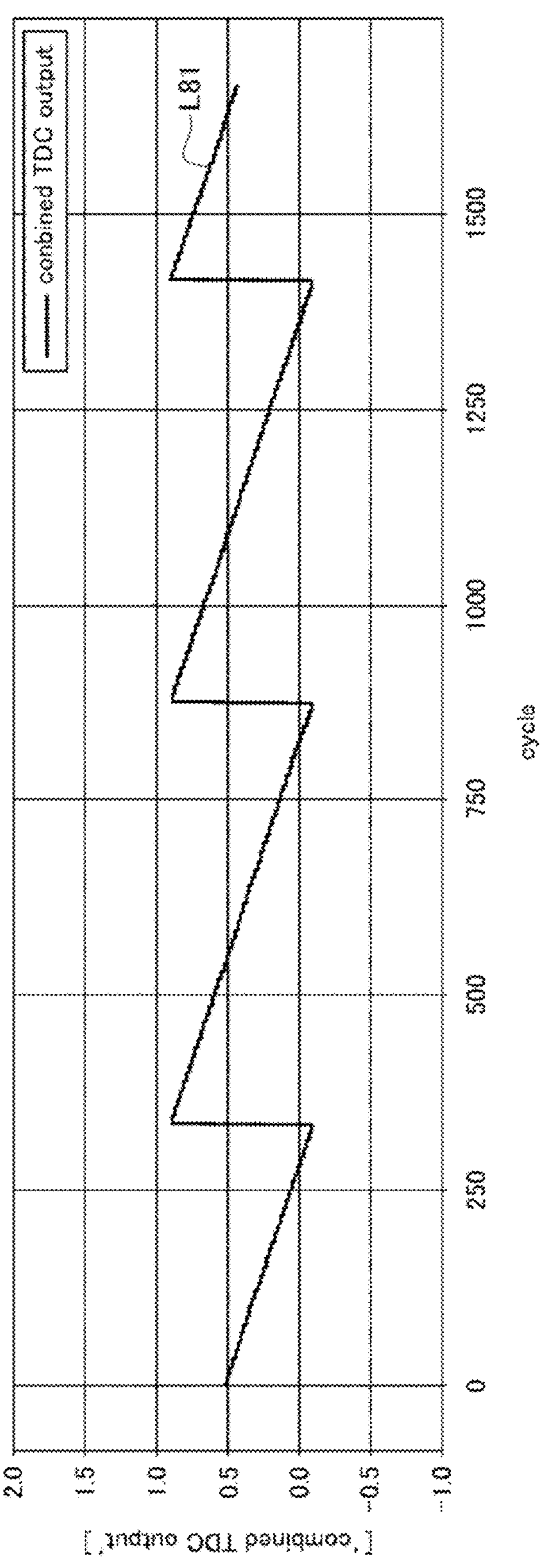
FIG. 11 is a diagram illustrating a first example of a combined TDC output according to a system simulation result of the ADPLL circuit in a case where a skew estimation value error exists.
Figure 12:
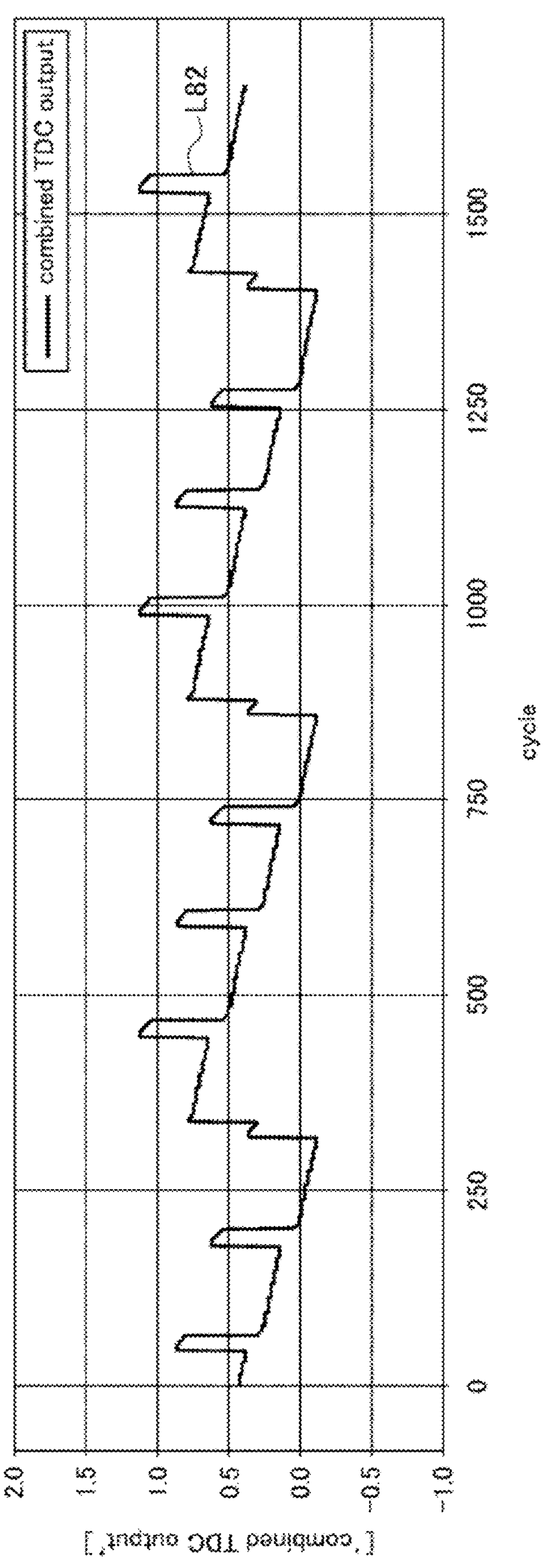
FIG. 12 is a diagram illustrating a second example of a combined TDC output according to a system simulation result of the ADPLL circuit in a case where a skew estimation value error exists.

Here, the results of the combined TDC output in the cases where there are different skew estimation errors obtained by the system simulation of the ADPLL circuit 10 are illustrated in FIGS. 11 and 12. In this simulation, the output frequency of the ADPLL circuit 10 is set such that the rise timing of REFCLK with respect to VCLK gradually shifts every cycle, and a skew of 0.2, which is normalized by VCLK_DIV, is provided between the coarse TDC 132 and the fine TDC 133.

FIG. 11 illustrates a simulation result in a case where the skew estimation value is shifted by −0.1. In this simulation result, as indicated by a line L81 in FIG. 11, a continuous combined TDC output as assumed in A in FIG. 10 described above is obtained.

On the other hand, FIG. 12 illustrates a simulation result in a case where the skew estimation value is shifted by −0.2 (in a case where the skew estimation value exceeds the constraint of ±0.125 described above). In this simulation result, it is confirmed that a discontinuous output as assumed in B of FIG. 10 described above is obtained.

As a method of obtaining the skew estimation value, for example, the skew estimation value can be determined from a delay difference between the clock paths obtained by circuit simulation. Alternatively, the skew estimation value may be determined by sweeping the skew estimation value in actual measurement and determining a value that makes the combined TDC output continuous.

<ADPLL System Simulation Result>

Figure 13:
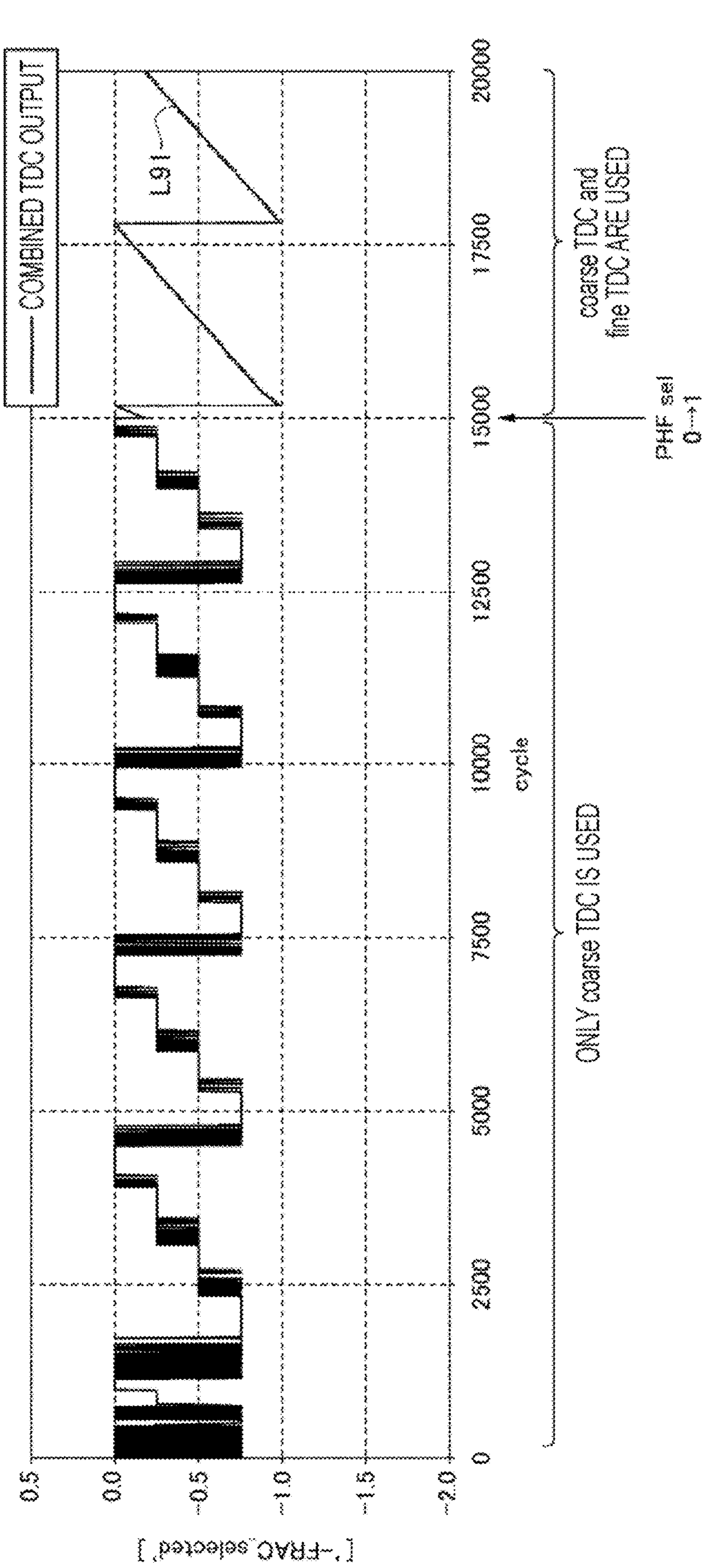
FIG. 13 is a diagram illustrating an example of a system simulation result of the ADPLL circuit.

FIG. 13 illustrates a system simulation result of the ADPLL circuit 10 when a skew of 250 psec exists between the coarse TDC 132 and the fine TDC 133 and the error of the skew estimation value is sufficiently small. In this simulation, the PHF sel signal is changed from "0" to "1" at 15000 cycles.

That is, before 15000 cycles, coarse phase difference information is output using only the coarse TDC 132, and after 15000 cycles, fine phase difference information is output using the coarse TDC 132 and the fine TDC 133. As indicated by the change of a line L91 in FIG. 13, it is indicated that the resolution of the combined TDC is smoothly switched before and after the change.

<ADPLL Operation Flow>

Next, the operation of the ADPLL circuit 10 will be described with reference to flowcharts of FIGS. 14 to 16. First, a basic operation of the ADPLL circuit 10 will be described with reference to the flowchart of FIG. 14.

Figure 14:
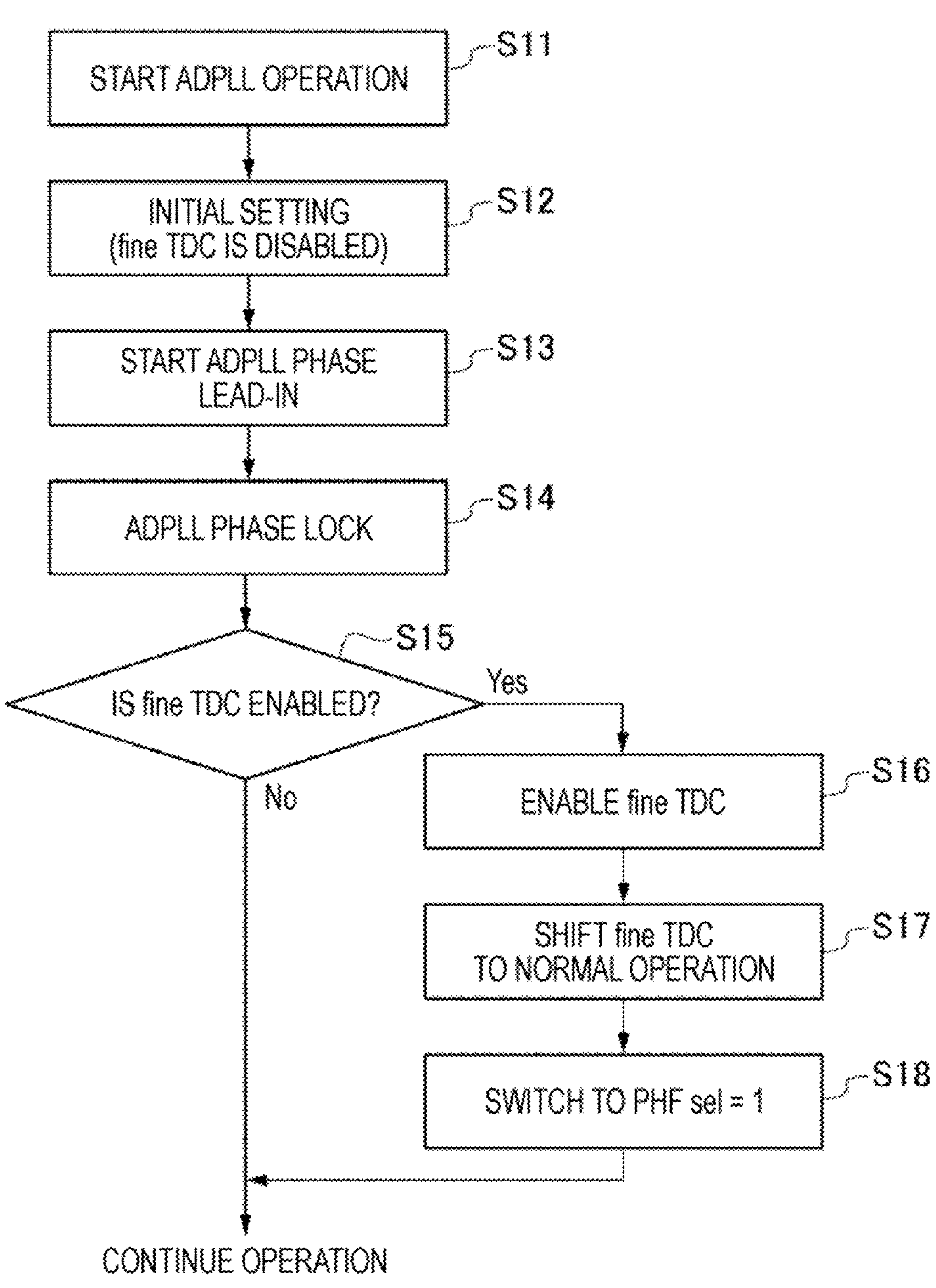
FIG. 14 is a flowchart for describing a first example of the operation of the ADPLL circuit.

As illustrated in FIG. 14, when the operation of the ADPLL circuit 10 is started (S11), the fine TDC 133 is disabled (S12) as the initial setting, and only the coarse TDC 132 is used. Then, in the ADPLL circuit 10, phase lead-in is started (S13), and the phase is locked (S14).

At this time, in a case where the fine TDC 133 is enabled ("Yes" in S15), the fine TDC 133 is enabled by the fine TDC EN signal to shift the operation to the normal operation (S16 and S17). Thereafter, the PHF sel signal is switched from "0" to "1" (S18). As a result, the outputs of the coarse TDC 132 and the fine TDC 133 are combined to output fine phase difference information. Here, the fine TDC 133 is enabled after the phase lock of the ADPLL circuit 10.

Furthermore, in a case where the fine TDC 133 is not enabled ("No" in S15), coarse phase difference information is output using only the coarse TDC 132.

Next, a modification of the operation of the ADPLL circuit 10 will be described with reference to the flowcharts of FIGS. 15 and 16. However, in FIGS. 15 and 16, similarly to FIG. 14 (S11 and S12), the fine TDC 133 is disabled as the initial setting at the start of the operation of the ADPLL circuit 10 (S31 and S32 in FIG. 15 and S51 and S52 in FIG. 16).

Figure 15:
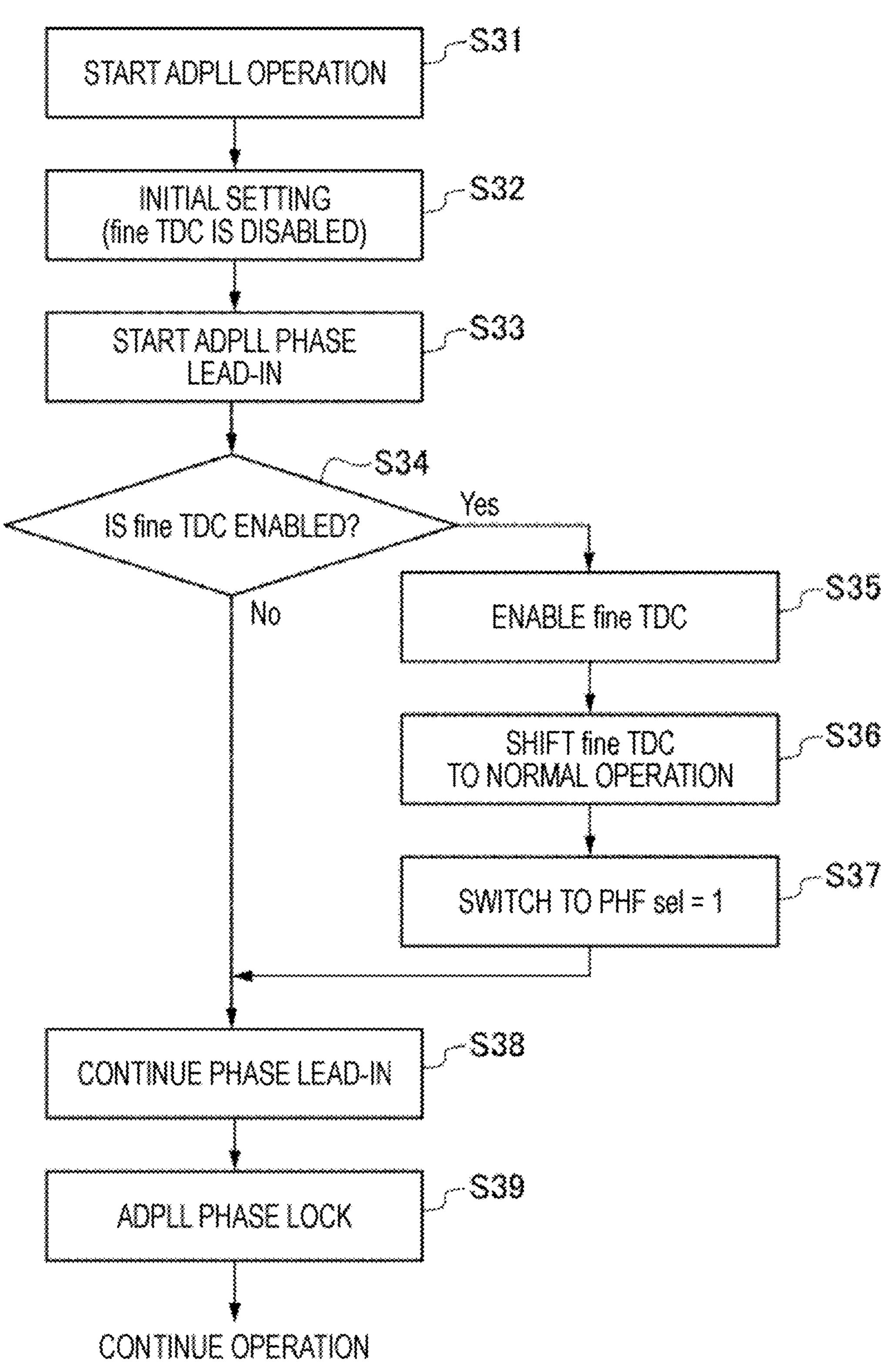
FIG. 15 is a flowchart illustrating a second example of the operation of the ADPLL circuit.

As illustrated in FIG. 15, in the ADPLL circuit 10, in a case where the fine TDC 133 is enabled after the phase lead-in is started (S33) ("Yes" in S34), the fine TDC 133 is enabled and the operation shifts to the normal operation (S35 and S36). Thereafter, the PHF sel signal is switched to "1" (S37). Then, in the ADPLL circuit 10, the phase lead-in is continued (S38), and the phase is locked (S39). That is, in the operation of the ADPLL circuit 10 illustrated in FIG. 15, the fine TDC 133 is enabled during the phase lead-in (before the phase lock).

Figure 16:
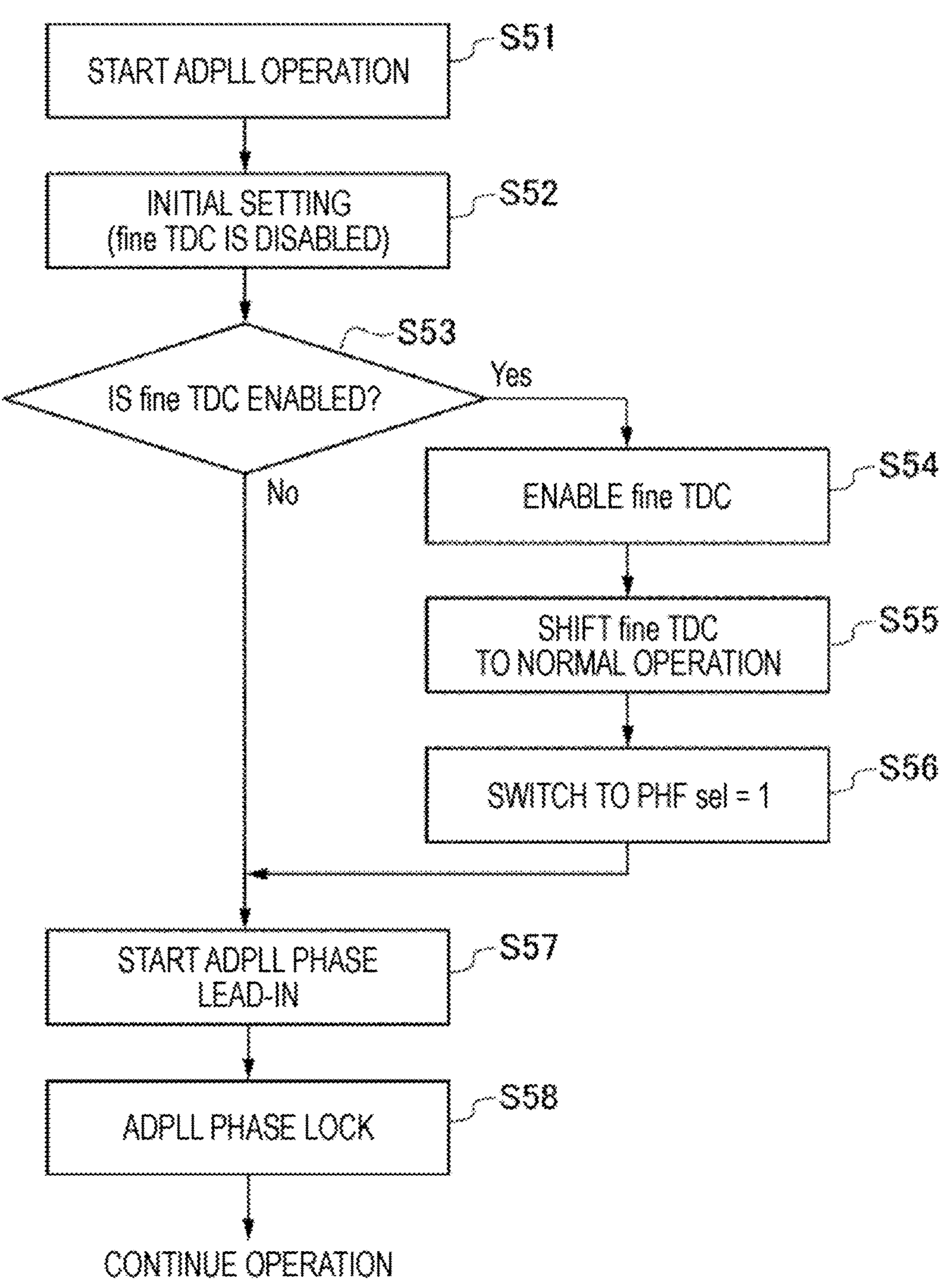
FIG. 16 is a flowchart for describing a third example of the operation of the ADPLL circuit.

As illustrated in FIG. 16, in the ADPLL circuit 10, in a case where the fine TDC 133 is enabled ("Yes" in S53), the fine TDC 133 is enabled and the operation shifts to the normal operation (S54 and S55). Thereafter, the PHF sel signal is switched to "1" (S56). Then, in the ADPLL circuit 10, the phase lead-in is started (S57), and the phase is locked (S58). That is, in the operation of the ADPLL circuit 10 illustrated in FIG. 16, the fine TDC 133 is enabled before the phase lead-in.

As described above, in the ADPLL circuit 10 to which the present disclosure is applied, the coarse TDC 132 and the fine TDC 133, which are two TDCs having different resolutions are arranged in parallel, and the fine TDC 133 can be disabled. Therefore, it is possible to provide an operation mode switching function of performing a low power consumption operation using only the coarse TDC 132 in a case where a bad jitter is allowed, and performing a high resolution operation by combining the coarse TDC 132 and the fine TDC 133 in a case where a low jitter is required. Furthermore, in the ADPLL circuit 10, the sel edge signal is output by the coarse TDC 132, which is easily downsized, so that a design such as a skew design that matches the clock synchronization unit 108 is facilitated. Moreover, an additional buffer or the like is unnecessary, and power consumption can be reduced.

Furthermore, in the ADPLL circuit 10, the output generation unit 135 can combine the outputs of the two TDCs, the coarse TDC 132 and the fine TDC 133, to generate and output the phase difference information. Here, the phase difference information is output on the basis of the PHF sel signal different from the fine TDC EN signal of the fine TDC 133, so that the influence of the unstable operation immediately after enabling the fine TDC 133 on the loop operation is avoided and seamless operation mode switching can be realized.

Furthermore, in the ADPLL circuit 10, VCLK toward the coarse TDC 132, the clock synchronization unit 108, and the accumulator 109 can be replaced with VCLK_DIV obtained by dividing VCLK by N using the N frequency divider 131. In that case, the resolution of the coarse TDC 132 is made finer than the VCLK period (=the output conversion measurement range of the fine TDC 133). As a result, the power consumption of the coarse TDC 132, the clock synchronization unit 108, and the accumulator 109 is reduced by the slow clock operation due to the N frequency divider 131 while the resolution of the information of the coarse TDC 132 is constrained and the information of the fine TDC 133 is interpolated in the information of the coarse TDC 132, so that the phase difference information can be correctly obtained without missing any information.

Furthermore, in the ADPLL circuit 10, the output generation unit 135 can add a skew estimation value corresponding to the skew between the coarse TDC 132 and the fine TDC 133 to the output of the fine TDC 133. Therefore, it is possible to correct the mismatch due to the clock skew between the coarse TDC 132 and the fine TDC 133 using the skew estimation value, and output correct phase difference information.

Here, for the ADPLL circuit that is a clock source, a required jitter differs depending on use. The resolution required for the TDC also differs depending on the required jitter. In a case where the required resolution is not high, a delay line TDC as disclosed in Patent Document 1 described above can be used. On the other hand, in a case where the required resolution is high, a vernier TDC as disclosed in Patent Document 3 described above can be used.

Figure 17:
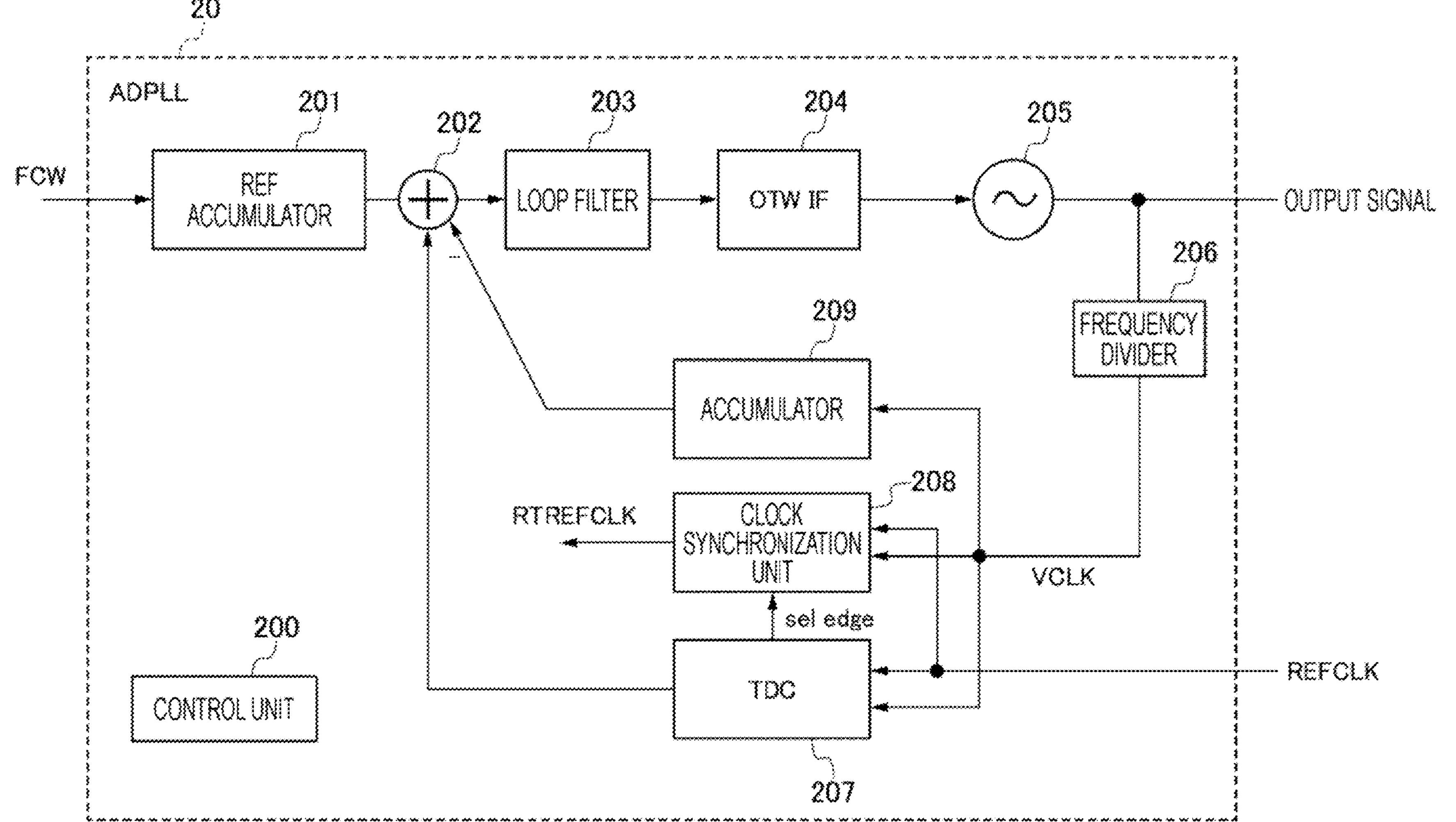
FIG. 17 is a block diagram illustrating a configuration example of a general ADPLL circuit.

FIG. 17 illustrates a configuration of a general ADPLL circuit 20. In FIG. 17, a control unit 200 to an accumulator 209 are illustrated corresponding to the control unit 100 to the accumulator 109 in FIG. 1, but the configuration of the TDC207 in FIG. 17 is different from the configuration of the TDC 107 in FIG. 1. That is, the TDC207 can be configured using a delay line TDC or a vernier TDC, but is different from a configuration like the configuration of the TDC 107 in FIG. 1, in which two TDCs, the coarse TDC 132 and the fine TDC 133 are arranged in parallel, and the fine TDC 133 can be disabled. Therefore, the enable signal (fine TDC EN signal) and the output selection signal (PHF sel signal) are not input to the TDC207.

In a case where the one ADPLL circuit 20 is used for various applications, the configuration using the TDC207 having a high resolution is used so as to satisfy the requirement for low jitter applications. On the other hand, in a case where this configuration is used for applications in which low jitter is not required, power consumption increases as compared with the optimal design. The ratio of the power consumption of the TDC207 in the ADPLL circuit 20 is large and has a large influence. Therefore, it is desirable to reduce the resolution of the TDC in accordance with the jitter requirement, and the power consumption accordingly. Note that, also in the ADPLL circuit 20 of FIG. 17, the frequency divider 206 is not necessarily provided.

Figure 18:
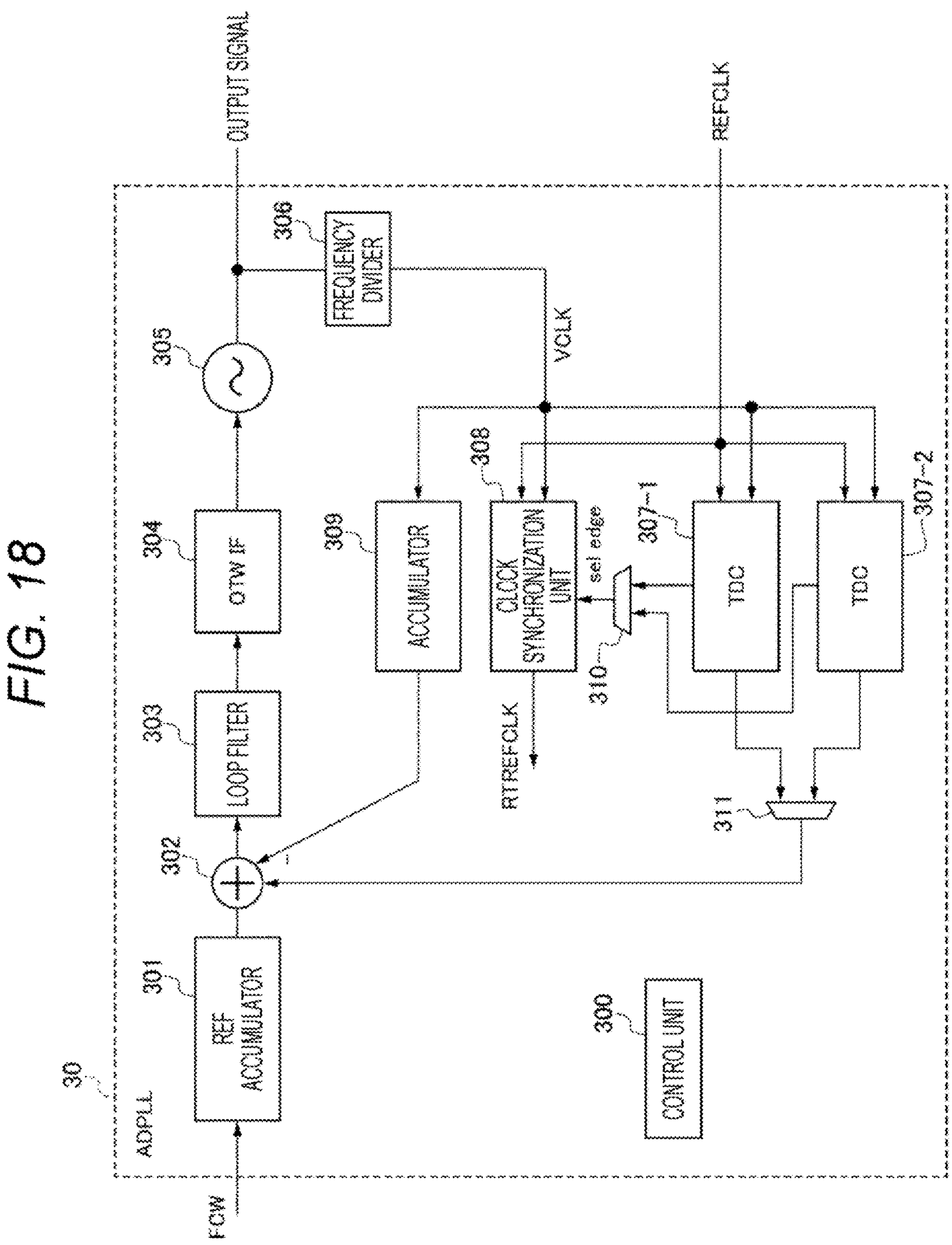
FIG. 18 is a block diagram illustrating a configuration example of an ADPLL circuit that provides a resolution switching function with the current technology.

It is possible to prepare two independent TDCs having different resolutions and use these two TDCs selectively even with the current technology. FIG. 18 illustrates a configuration of an ADPLL circuit 30 that provides a resolution switching function with the current technology. In FIG. 18, a control unit 300 to an accumulator 309 are illustrated corresponding to the control unit 100 to the accumulator 109 in FIG. 1, but the ADPLL circuit 30 has a configuration in which a TDC307-1 and a TDC307-2 in FIG. 18 are provided instead of the TDC 107 in FIG. 1.

The ADPLL circuit 30 of FIG. 18 has a configuration, in which the two independent TDCs, the TDC307-1 and the TDC307-2, are selectively used, and thus a selector 310 that selects one of the clock synchronization selection signals (sel edge signals) output from the two TDCs and outputs the selected signal to the clock synchronization unit 308 and a selector 311 that selects one of the outputs of the two TDCs are provided. In the ADPLL circuit 30 of FIG. 18, it is necessary to match a skew at three points including the clock synchronization unit 308 and two independent TDCs, the TDC307-1 and the TDC307-2, which makes it difficult to design. On the other hand, in the ADPLL circuit 10 of FIG. 1, the coarse TDC 132 (FIG. 2) having a coarse resolution and a small size can be arranged in the vicinity of the clock synchronization unit 108, and the clock skew can be minimized as described above. Note that, also in the ADPLL circuit 30 of FIG. 18, the frequency divider 306 is not necessarily provided.

Furthermore, in a case where the resolution switching is realized by a 2-step TDC as disclosed in Patent Document 2 stated above, other problems such as a complicated routing configuration of the 2-step TDC itself and occurrence of nonlinearity due to a time-amplifier occur.

<Modifications>

In the above description, the configuration of the TDC 107 of FIG. 2, in which the N frequency divider 131 is provided has been described, but the N frequency divider 131 is not necessarily provided. Furthermore, the N frequency divider 131 may be configured to generate a multiphase clock.

In the TDC 107, the fine TDC 133 that can be disabled may be enabled and then switched to disable by switching the input of the fine TDC EN signal. For example, in the ADPLL operation flow illustrated in FIGS. 14 to 16, the fine TDC 133 is disabled as an initial setting, and then the fine TDC 133 can be enabled, but the enabled fine TDC 133 can be further disabled thereafter.

Note that embodiments of the present disclosure are not limited to the embodiments described above, and various modifications are possible without departing from the scope of the present disclosure. Furthermore, the advantageous effects described in the present specification are merely illustrative and not restrictive. The present technology may produce other advantageous effects.

Furthermore, the present disclosure can have the following configurations.

(1)

An all digital phase-locked loop circuit including:

a first time-to-digital converter that performs phase difference detection at a first resolution; and a second time-to-digital converter that performs phase difference detection at a second resolution finer than the first resolution and that is arranged in parallel with the first time-to-digital converter, in which the second time-to-digital converter is configured to allow being disabled, and the first time-to-digital converter outputs a clock synchronization selection signal used for synchronizing a reference clock signal to a clock synchronization unit that generates a clock signal of a digital part.

(2)

The all digital phase-locked loop circuit according to (1) further including an output generation unit that outputs the phase difference information on the basis of an output selection signal for selecting an output of the first time-to-digital converter, an output of the second time-to-digital converter, and an output of the phase difference information.

(3)

The all digital phase-locked loop circuit according to (2), in which the output generation unit outputs the phase difference information on the basis of an output of the first time-to-digital converter when the second time-to-digital converter is disabled and outputs the phase difference information on the basis of an output of the first time-to-digital converter, an output of the second time-to-digital converter, and the output selection signal when the second time-to-digital converter is enabled.

(4)

The all digital phase-locked loop circuit according to (2) or (3), further including an N frequency divider for an output signal input in common to the first time-to-digital converter, the clock synchronization unit, and an accumulator that accumulates an accumulated value added to the phase difference information, in which the output signal is a signal output from a digitally controlled oscillator, and the accumulated value is obtained by accumulating a predetermined value in synchronization with the output signal.

(5)

The all digital phase-locked loop circuit according to (4), in which a resolution of the first time-to-digital converter is finer than a period of the output signal.

(6)

The all digital phase-locked loop circuit according to (3), in which the output generation unit includes a nearest neighbor correction unit and a first adder, and the nearest neighbor correction unit and the first adder add a value corresponding to an integral multiple of a measurement range of the second time-to-digital converter to an output of the second time-to-digital converter to correct a result of the addition to a value most matching the first time-to-digital converter.

(7)

The all digital phase-locked loop circuit according to (6), in which the output generation unit further includes a second adder that adds a value corresponding to a skew between the first time-to-digital converter and the second time-to-digital converter to an output of the second time-to-digital converter.

(8)

The all digital phase-locked loop circuit according to (7), in which the output generation unit further includes a selector that selects, on the basis of the output selection signal, an output of the first time-to-digital converter or an output generated on the basis of an output of the first time-to-digital converter and an output of the second time-to-digital converter and outputs the selected output as the phase difference information.

(9)

The all digital phase-locked loop circuit according to (8), further including a control unit that independently controls an enable signal input to the second time-to-digital converter and the output selection signal input to the selector.

(10)

The all digital phase-locked loop circuit according to (4), in which the second time-to-digital converter includes a main circuit that performs phase difference detection at the second resolution and a 1/N multiplier arranged at a subsequent stage of the main circuit.

(11)

The all digital phase-locked loop circuit according to (4), in which the digitally controlled oscillator outputs, as the output signal, a signal of an oscillation frequency indicated by an oscillator control word according to a control value obtained from phase error information, and the phase error information is generated by subtracting phase information obtained by adding the phase difference information and the accumulated value from phase control information obtained from a frequency control input.

REFERENCE SIGNS LIST

10 ADPLL circuit
100 Control unit
101 REF accumulator
102 Adder
103 Loop filter
104 OTW IF
105 DCO
106 Frequency divider
107 TDC
108 Clock synchronization unit
109 Accumulator
131 N frequency divider
132 coarse TDC
133 fine TDC
133A fine TDC main circuit
134 1/N multiplier
135 Output generation unit
151 Selector
152 Nearest neighbor correction unit
153 Adder
154 Adder

The invention claimed is:

1. An all digital phase-locked loop circuit comprising:

a first time-to-digital converter that performs phase difference detection at a first resolution; and a second time-to-digital converter that performs phase difference detection at a second resolution finer than the first resolution and that is arranged in parallel with the first time-to-digital converter, wherein the second time-to-digital converter is configured to allow being disabled, and the first time-to-digital converter outputs a clock synchronization selection signal used for synchronizing a reference clock signal to a clock synchronization circuit that generates a clock signal of a digital part.

2. The all digital phase-locked loop circuit according to claim 1 further comprising an output generation circuit that outputs phase difference information on a basis of an output selection signal for selecting an output of the first time-to-digital converter, an output of the second time-to-digital converter, and an output of the phase difference information.

3. The all digital phase-locked loop circuit according to claim 2, wherein the output generation circuit outputs the phase difference information on a basis of an output of the first time-to-digital converter when the second time-to-digital converter is disabled and outputs the phase difference information on a basis of an output of the first time-to-digital converter, an output of the second time-to-digital converter, and the output selection signal when the second time-to-digital converter is enabled.

4. The all digital phase-locked loop circuit according to claim 2, further comprising an N frequency divider for an output signal that is input in common to the first time-to-digital converter, the clock synchronization circuit, and an accumulator that accumulates an accumulated value added to the phase difference information, wherein the output signal is a signal output from a digitally controlled oscillator, and the accumulated value is obtained by accumulating a predetermined value in synchronization with the output signal.

5. The all digital phase-locked loop circuit according to claim 4, wherein a resolution of the first time-to-digital converter is finer than a period of the output signal.

6. The all digital phase-locked loop circuit according to claim 3, wherein the output generation circuit includes a nearest neighbor correction circuit and a first adder, and the nearest neighbor correction circuit and the first adder add a value corresponding to an integral multiple of a measurement range of the second time-to-digital converter to an output of the second time-to-digital converter to correct a result of an addition to a value most matching the first time-to-digital converter.

7. The all digital phase-locked loop circuit according to claim 6, wherein the output generation circuit further includes a second adder that adds a value corresponding to a skew between the first time-to-digital converter and the second time-to-digital converter to an output of the second time-to-digital converter.

8. The all digital phase-locked loop circuit according to claim 7, wherein the output generation circuit further includes a selector that selects, on a basis of the output selection signal, an output of the first time-to-digital converter or an output generated on a basis of an output of the first time-to-digital converter and an output of the second time-to-digital converter and outputs the selected output as the phase difference information.

9. The all digital phase-locked loop circuit according to claim 8, further comprising a control unit that independently controls an enable signal input to the second time-to-digital converter and the output selection signal that is input to the selector.

10. The all digital phase-locked loop circuit according to claim 4, wherein the second time-to-digital converter includes a main circuit that performs phase difference detection at the second resolution and a 1/N multiplier arranged at a subsequent stage of the main circuit.

11. The all digital phase-locked loop circuit according to claim 4, wherein the digitally controlled oscillator outputs, as the output signal, a signal of an oscillation frequency indicated by an oscillator control word according to a control value obtained from phase error information, and the phase error information is generated by subtracting phase information obtained by adding the phase difference information and the accumulated value from phase control information obtained from a frequency control input.

* * * * *